(12) United States Patent
Chen et al.

(10) Patent No.: US 8,245,074 B2
(45) Date of Patent: Aug. 14, 2012

(54) CLOCK INTEGRATED CIRCUIT

(75) Inventors: Chung-Kuang Chen, Taipei (TW);
Chun-Hsiung Hung, Hsinchu (TW);
Han-Sung Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 493 days.

(21) Appl. No.: 12/631,693

(22) Filed: Dec. 4, 2009

(65) Prior Publication Data

US 2011/0138216 A1     Jun. 9, 2011

(51) Int. Cl.
*G06F 1/12* (2006.01)
*G06F 1/00* (2006.01)
*G06F 1/04* (2006.01)
*G06F 11/00* (2006.01)
*H03B 5/32* (2006.01)

(52) U.S. Cl. ........ 713/503; 713/400; 713/500; 713/600; 331/187

(58) Field of Classification Search ........................ None
See application file for complete search history.

(56) References Cited

U.S. PATENT DOCUMENTS

| | | | |
|---|---|---|---|
| 6,092,217 A * | 7/2000 | Kanekawa et al. | 714/11 |
| 6,933,754 B2 * | 8/2005 | Restle | 327/77 |
| 7,075,353 B1 | 7/2006 | Wan et al. | |
| 7,142,005 B1 | 11/2006 | Gaboury | |
| 7,558,390 B2 * | 7/2009 | Nielsen et al. | 381/103 |
| 7,961,027 B1 * | 6/2011 | Chen et al. | 327/291 |
| 8,148,967 B2 * | 4/2012 | Xing et al. | 323/288 |

* cited by examiner

*Primary Examiner* — Ji H Bae

(74) *Attorney, Agent, or Firm* — Kenta Suzue; Haynes Beffel & Wolfeld LLP

(57) ABSTRACT

The clock circuit of an integrated circuit operates with variations such as temperature, ground noise, and power noise. Various aspects of an improved clock integrated circuit address one or more of the variations in temperature, ground noise, and power noise.

24 Claims, 30 Drawing Sheets

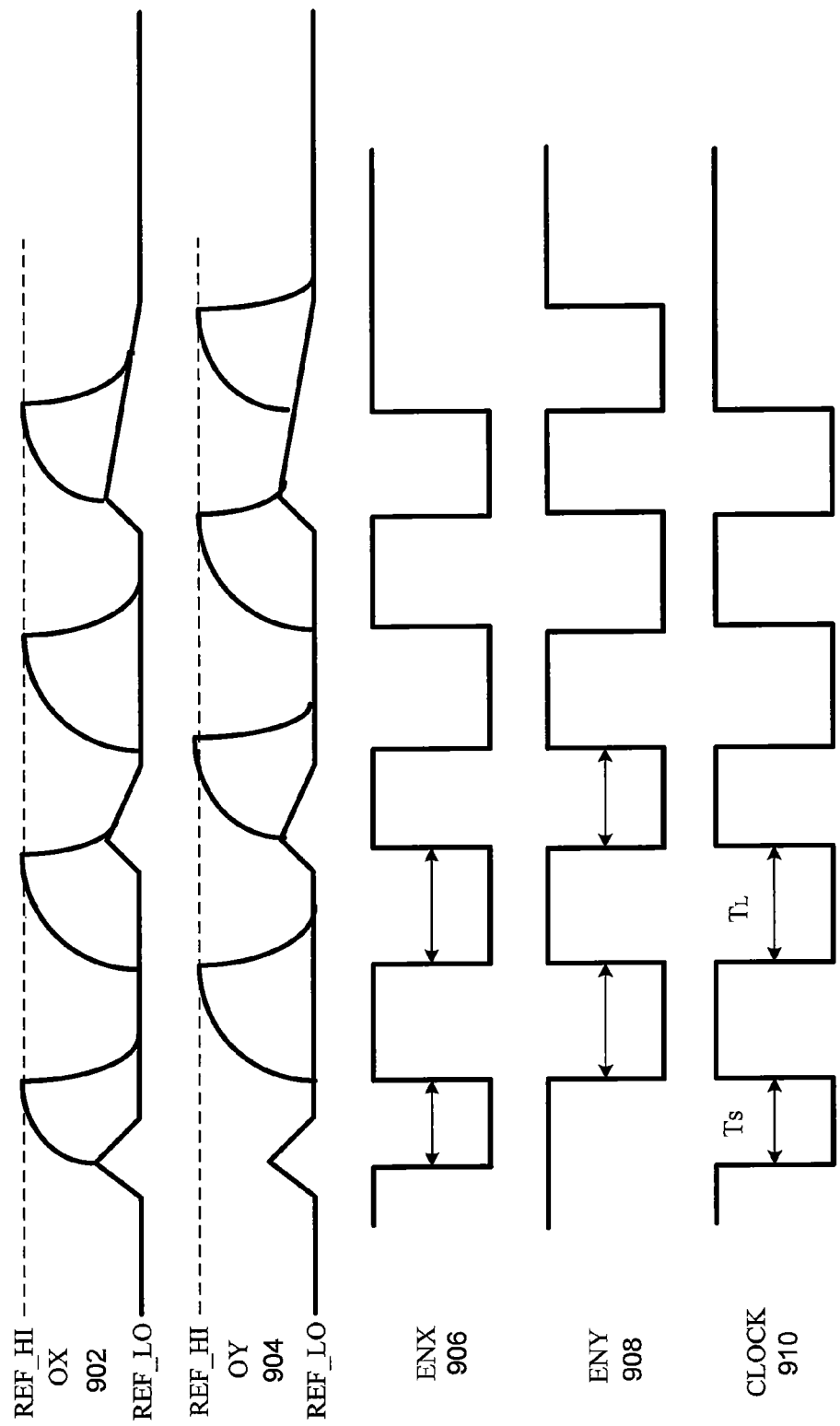

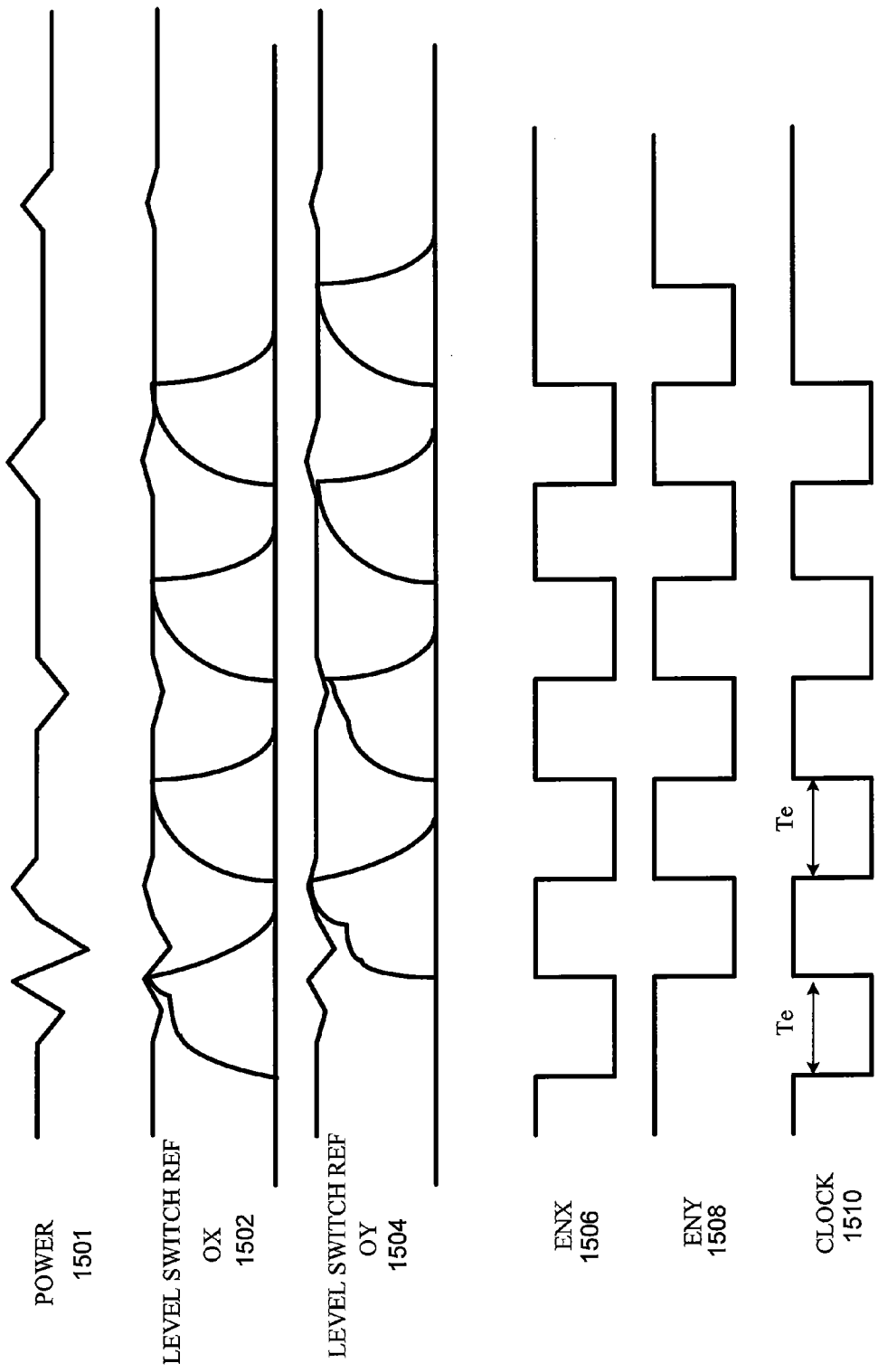

CLOCK INTEGRATED CIRCUIT

BACKGROUND

1. Field of the Invention

The present technology relates to an integrated circuit with a clock circuit, tolerant to variations such as temperature, ground noise, and power noise.

2. Description of Related Art

The clock circuit of an integrated circuit operates with variations such as temperature, ground noise, and power noise. Because these variations affect the final timing of the output clock signal, various approaches address the variations in order to generate a uniform output clock signal despite the variations.

For example, U.S. Pat. No. 7,142,005 by Gaboury seeks to decouple power fluctuations from the clock signal, by adding buffer circuits with active loads, independent bias circuitry, and bias circuitry. These relatively complicated buffer circuits devote significantly more die area, and cost, to isolating such power fluctuations from the clock circuit.

What is needed is an approach to address such variations with reduced complexity and cost.

SUMMARY

One aspect of the technology is an apparatus with a clock integrated circuit.

The clock integrated circuit has a first reference signal (for example, a first reference voltage such as a ground). The first reference signal includes a varying noise signal.

The clock integrated circuit also has a timing circuit having an output alternating between the first reference signal and a second reference signal, at a rate determined by a time constant (such as a time constant of an exponential signal) determining timing of a clock signal output of the clock integrated circuit. An output of the timing circuit stores the value of the varying noise signal included in the first reference signal. The timing circuit output changes between (i) falling from the second reference signal to the first reference signal and (ii) rising from the first reference signal to the second reference signal.

The clock integrated circuit also has a reference circuit having an output selectably coupled to the varying noise signal. Selectably coupled, means that the output of the reference circuit stores the value of the varying noise signal, when the timing circuit output changes between (i) falling from the second reference signal to the first reference signal and (ii) rising from the first reference signal to the second reference signal.

The clock integrated circuit also has a level switching circuit comparing the output of the reference circuit with the output of the timing circuit. An output of the level switching circuit determines the clock signal output of the clock integrated circuit.

In some embodiments, the first reference signal is a first reference voltage, the second reference signal is a second reference voltage. In some embodiments, the varying noise signal is a varying noise voltage. The timing circuit alternates between charging from the first reference voltage to the second reference voltage and discharging from the second reference voltage to the first reference voltage. In some embodiments, the output of the reference circuit stores the value of the varying noise signal, when the timing circuit output changes from (i) falling from the second reference voltage to the first reference voltage to (ii) rising from the first reference voltage to the second reference voltage.

In some embodiments, the timing circuit selectably receives the varying noise signal included in the first reference signal, depending on whether the output of the timing circuit is (i) falling from the second reference signal to the first reference signal or (ii) rising from the first reference signal to the second reference signal.

In some embodiments, the output of the reference circuit being coupled to the varying noise signal corresponds to the timing circuit falling from the second reference signal to the first reference signal, and the output of the reference circuit being decoupled from the varying noise signal corresponds to the timing circuit rising from the first reference signal to the second reference signal. In some embodiments, the output of the reference circuit is configured to store the value of the varying noise signal when the timing circuit changes from (i) falling from the second reference signal to the first reference signal to (ii) rising from the first reference signal to the second reference signal.

In some embodiments, the level switching circuit compares the output of the reference circuit including the stored value of the varying noise signal, with the output of the timing circuit including the stored value of the varying noise signal, to determine the clock signal output of the clock integrated circuit.

In some embodiments, the timing circuit is configured to couple the first reference signal to the timing circuit and decouple the second reference signal from the timing circuit. The first reference signal has the varying noise signal, such that the timing circuit discharges from the second reference signal to the first reference signal. The timing circuit is configured to decouple the first reference signal from the timing circuit and couple the second reference signal to the timing circuit. The first reference signal has the varying noise signal. The timing circuit charges from the first reference signal to the second reference signal. In some embodiments, the timing circuit is configured to store the value of the varying noise signal at the timing circuit when the timing circuit changes from (i) falling from the second reference signal to the first reference signal to (ii) rising from the first reference signal to the second reference signal.

In some embodiments, the clock integrated circuit also includes a latch circuit generating the clock signal output of the clock integrated circuit, responsive to the output of the level switching circuit.

One aspect of the technology is a clocking method. Some embodiments include the steps of:

determining timing of a clock integrated circuit by alternating a timing circuit output between a first reference signal and a second reference signal at a rate determined by a time constant determining the timing of the clock integrated circuit, wherein an output of the timing circuit stores a value of a varying noise signal included in the first reference signal, when the timing circuit output changes between (i) falling from the second reference signal to the first reference signal and (ii) rising from the first reference signal to the second reference signal;

selectably coupling the varying noise signal to a reference circuit output of the clock integrated circuit, such that the reference circuit output stores the value of the varying noise signal, when the timing circuit output changes between (i) falling from the second reference signal to the first reference signal and (ii) rising from the first reference signal to the second reference signal; and comparing the reference circuit output with the timing circuit output, to determine a clock signal output of the clock integrated circuit.

In some embodiments, the first reference signal is a first reference voltage, the second reference signal is a second reference voltage, and the timing circuit alternates between charging from the first reference voltage to the second reference voltage and discharging from the second reference voltage to the first reference voltage.

In some embodiments, the first reference signal is a first reference voltage, the second reference signal is a second reference voltage, and the varying noise signal is a varying noise voltage.

In some embodiments, the first reference signal is a ground reference voltage.

In some embodiments, the time constant characterizes an exponential signal.

In some embodiments, said comparing, includes:

comparing the reference circuit output including the stored value of the varying noise signal, with the timing circuit output including the stored value of the varying noise signal, to determine the clock signal output of the clock integrated circuit.

In some embodiments, said determining the timing includes:

coupling the first reference signal to the timing circuit and decoupling the second reference signal from the timing circuit, wherein the first reference signal has the varying noise signal, such that the timing circuit discharges from the second reference signal to the first reference signal; and decoupling the first reference signal from the timing circuit and coupling the second reference signal to the timing circuit, wherein the first reference signal has the varying noise signal, such that the timing circuit charges from the first reference signal to the second reference signal.

In some embodiments, said decoupling includes:

storing the value of the varying noise signal at the timing circuit when the timing circuit changes from (i) falling from the second reference signal to the first reference signal to (ii) rising from the first reference signal to the second reference signal.

In some embodiments, said selectably coupling includes:

coupling the reference circuit output to the varying noise signal, to correspond to (ii) falling from the second reference signal to the first reference signal; and decoupling the reference circuit output from the varying noise signal, to correspond to (ii) rising from the first reference signal to the second reference signal, including:

storing the value of the varying noise signal output at the timing circuit when the timing circuit changes from (i) falling from the second reference signal to the first reference signal to (ii) rising from the first reference signal to the second reference signal.

In some embodiments, said comparing, includes:

after said comparing the reference circuit output with the timing circuit output, generating the clock signal output of the clock integrated circuit with a latch circuit.

One aspect of the technology is a method of manufacturing an apparatus, comprising:

providing a clock integrated circuit, comprising:

providing a first reference signal including a varying noise signal;

providing a timing circuit having an output alternating between the first reference signal and a second reference signal at a rate determined by a time constant determining timing of a clock signal output of the clock integrated circuit, wherein an output of the timing circuit stores the value of the varying noise signal included in the first reference signal, when the timing circuit output changes between (i) falling from the second reference signal to the first reference signal and (ii) rising from the first reference signal to the second reference signal;

providing a reference circuit having an output selectably coupled to the varying noise signal, such that the output of the reference circuit stores the value of the varying noise signal, when the timing circuit output changes between (i) falling from the second reference signal to the first reference signal and (ii) rising from the first reference signal to the second reference signal; and providing a level switching circuit comparing the output of the reference circuit with the output of the timing circuit, such that an output of the level switching circuit determines the clock signal output of the clock integrated circuit.

BRIEF DESCRIPTION OF THE DRAWINGS

FIG. 9 is a set of graphs of voltage versus time, showing how clock circuitry that is intolerant of ground noise, will generate clock timing that varies widely with time-varying ground noise.

FIG. 15 is a set of graphs of voltage versus time, showing how clock circuitry that is tolerant of power noise, will generate clock timing that is fairly constant with time-varying power noise, due to circuitry such as that in FIGS. 11 and 12.

FIGS. 16A and 16B are circuit diagrams of an integrated clock circuit with tolerance to power noise, including transistors that share a common noise phase of power noise in the timing circuitry power, and power noise in the reference signal used in level detection of the timing circuitry output, similar to FIG. 11, and adding switch circuitry to selectively bypass the noise tolerant circuitry, such as during power on.

DETAILED DESCRIPTION

Figure 1:
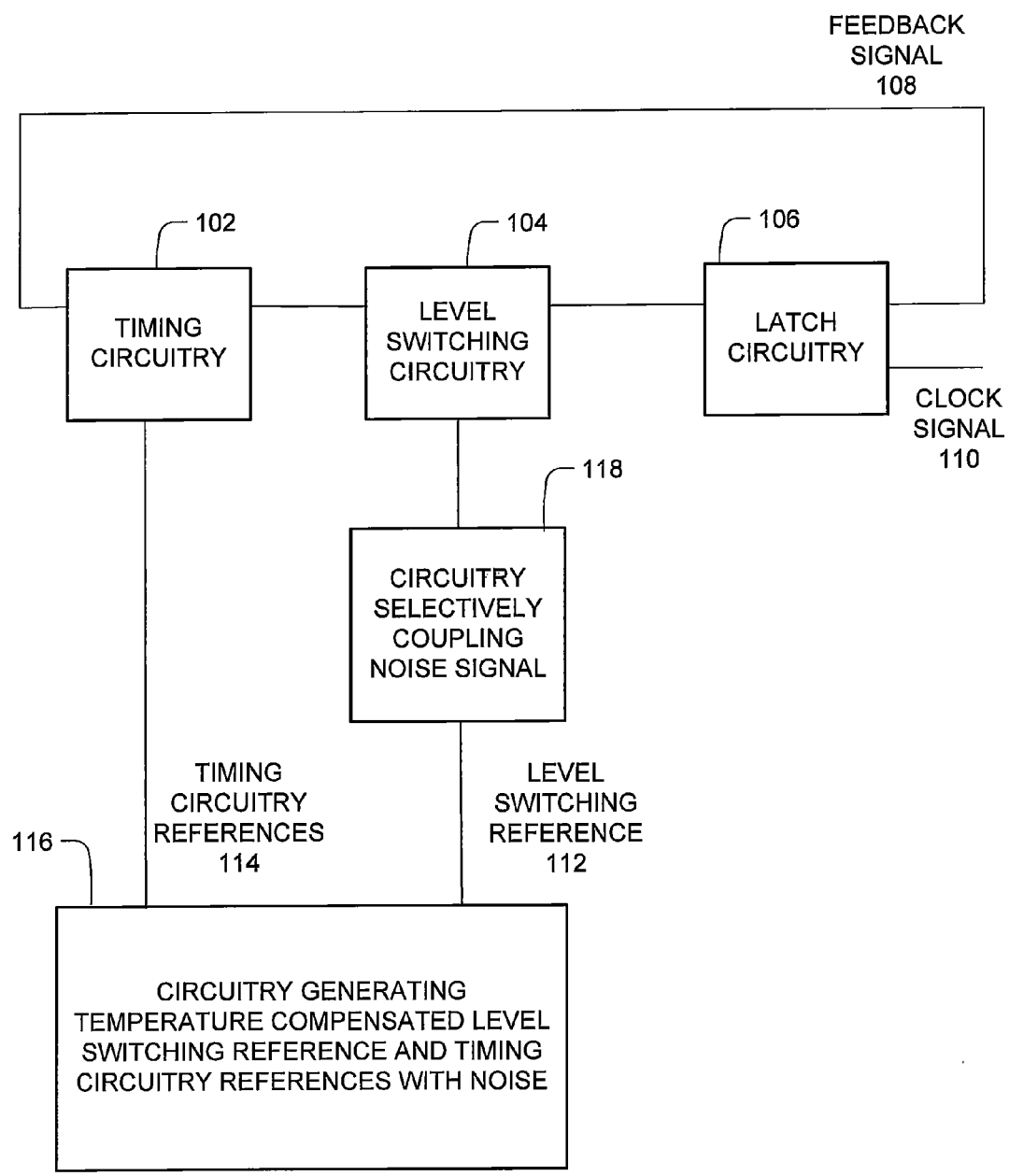
FIG. 1 is a block diagram of an integrated clock circuit with tolerance to variations such as temperature, ground voltage, and power voltage.

FIG. 1 is a block diagram of an integrated clock circuit with tolerance to variations such as temperature, ground voltage, and power voltage.

The clock integrated circuit generally has a loop structure, with timing circuitry 102, level switching circuitry 104, and latch circuitry 106. The latch circuitry 106 generates a feedback signal from latch circuitry 106 back to timing circuitry 102, and the clock signal output 110. The timing circuitry 102 alternates between two reference signals according to a time constant. The time constant accordingly determines the timing of the clock integrated circuit. A typical example of the time constant is an exponential time constant that characterizes the rise and fall of an RC circuit or an RL circuit. The level switching circuitry monitors the output of the timing circuitry 102, and changes the output depending on whether the timing circuitry 102 is sufficiently high, or low. Examples of latch circuitry 106 are an SR latch, SR NAND latch, JK latch, gated SR latch, gated D latch, gated toggle latch. The latch circuitry 106 has two stable states and alternates between the two stable states to generate the clock signal output 110.

The two reference signals relied on by the timing circuitry 102 are generated by circuitry 116, which also generates the level switching reference relied on by the level switching circuitry 104. By commonly generating both the reference signals relied on by the timing circuitry 102, and the level switching reference relied on by the level switching circuitry 104, circuitry 116 minimizes the noise phase of a noise signal shared by the reference signals relied on by the timing circuitry 102, and the level switching reference relied on by the level switching circuitry 104. Because any noise phase is minimal, peaks and valleys in the noise signal that occur in the reference signals relied on by the timing circuitry 102, are synchronous with peaks and valleys in the noise signal that occur in the level switching reference relied on by the level switching circuitry 104.

The level switching reference 112 relied on by the level switching circuitry 104, is selectively coupled to the level switching circuitry 104 by circuitry 118. In some embodiments, this acts as a sample and hold of ground noise, so that the same ground noise is held by the timing circuitry 102, and by the level switching reference circuitry relied on by the level switching circuitry 104.

Although the shown block diagram addresses the variations in temperature, ground noise, and power noise, various embodiments of an improved clock integrated circuit address just one of these variations (e.g., just temperature, just power noise, or just ground noise), or just two of these variations (e.g., just temperature and power noise, just temperature and ground noise, or just power noise and ground noise).

Figure 2A:
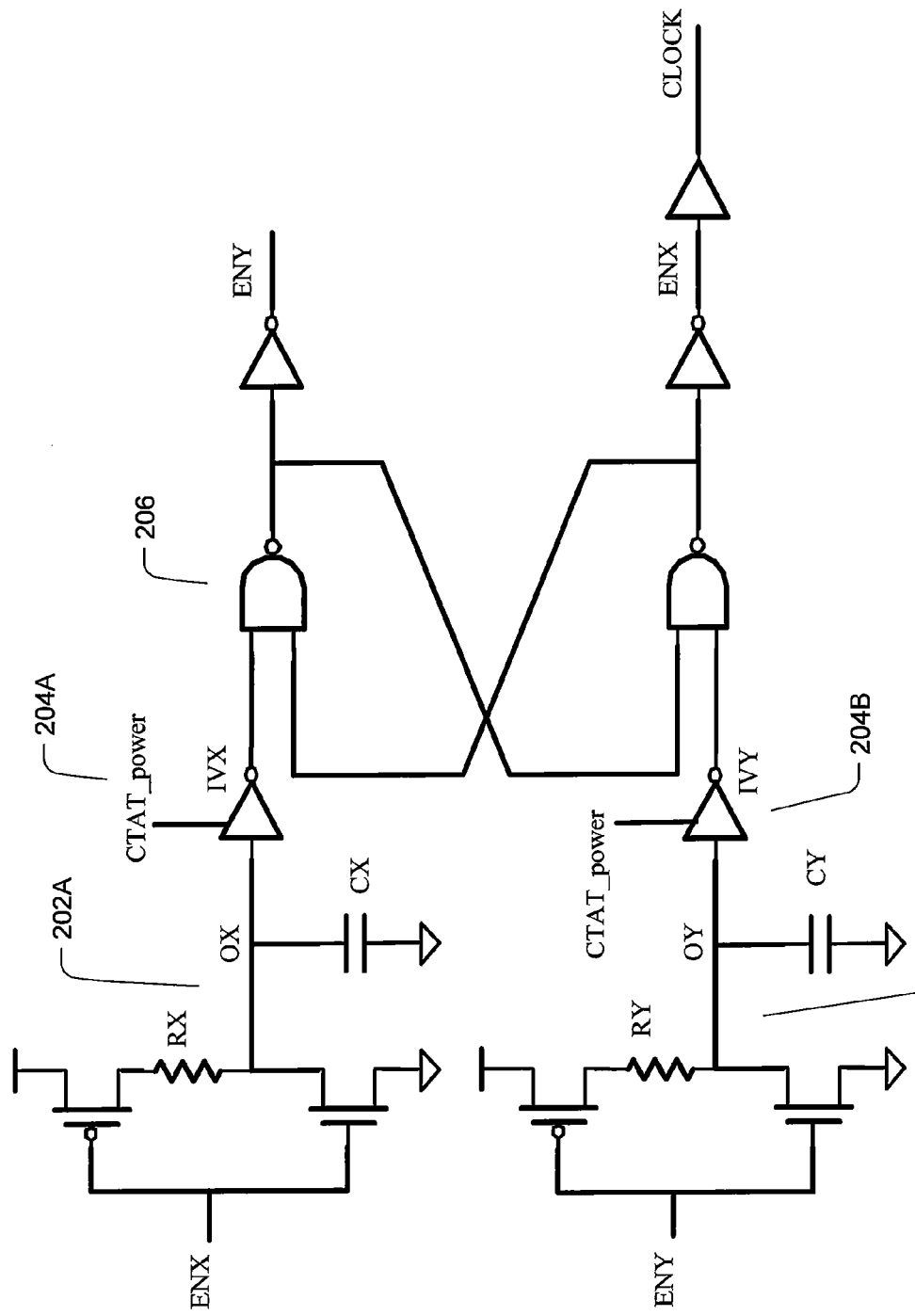
FIGS. 2A and 2B are circuit diagrams of an integrated clock circuit with tolerance to temperature variations, including inverter circuitry to evaluate the timing circuitry output, where FIG. 2A has capacitive timing circuitry coupled towards the ground, and FIG. 2B has capacitive timing circuitry coupled towards power.
Figure 2B:
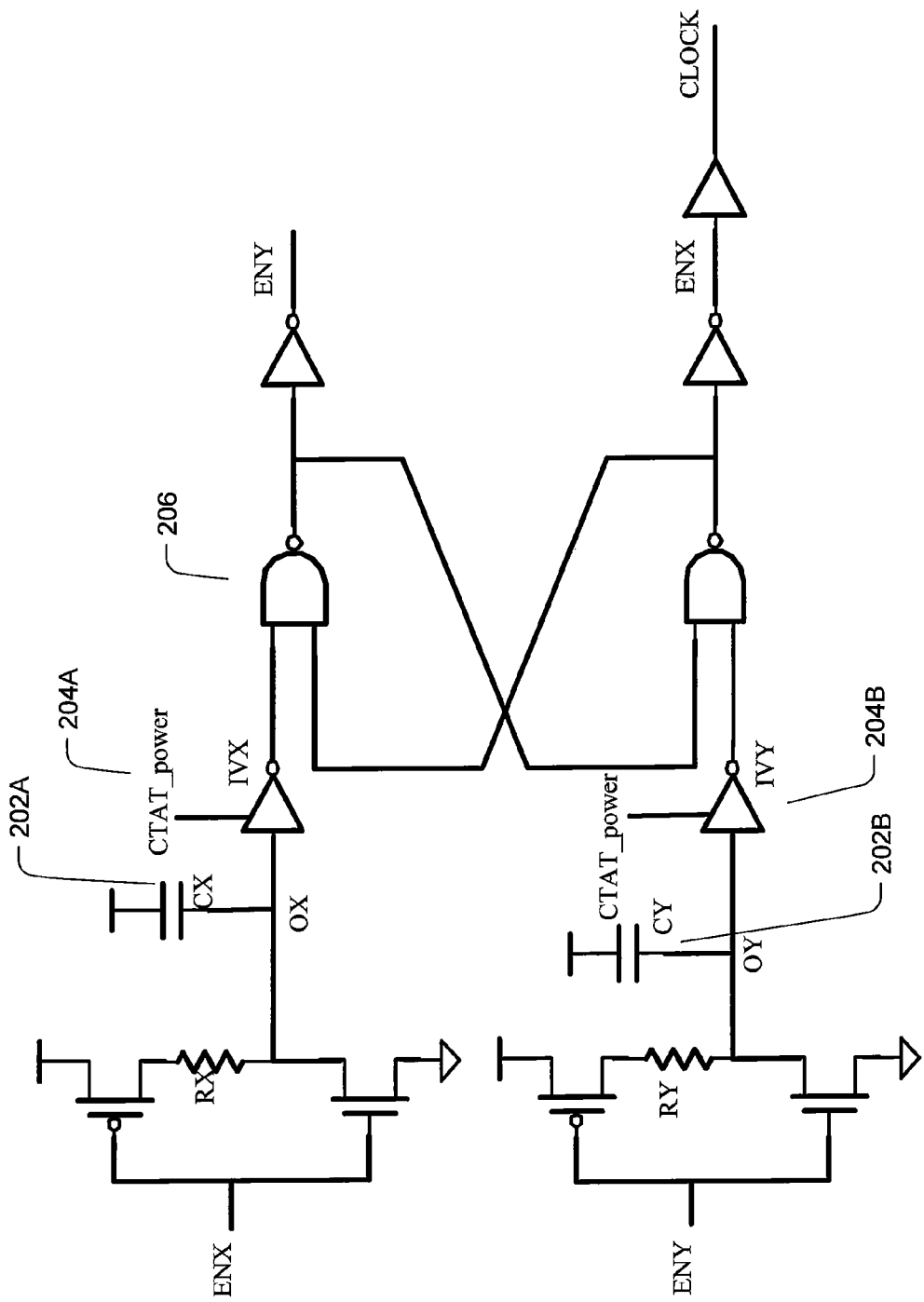

FIGS. 2A and 2B are circuit diagrams of an integrated clock circuit with tolerance to temperature variations, including inverter circuitry to evaluate the timing circuitry output.

Shown are parallel instances of timing circuitry 202A and 202B, parallel instances of inverter circuitry 204A and 204B, and the latch circuitry 206. The timing circuitry 202A and 202B is generally an inverter with resistance RX or RY, charging to or discharging from capacitance CX or CY, to change the output voltage at OX or OY.

FIG. 2A shows an embodiment where the capacitance CX or CY is coupled to a common ground. Although all possible variations are not explicitly shown in the Figures, the present technology covers all disclosed instances of the clock circuit showing the capacitance CX or CY, where the clock circuit is modified to couple the capacitance CX or CY to ground.

In one embodiment, the capacitance CX or CY is actually a PMOS transistor with the opposite terminal decoupled from a common ground with the inverters.

FIG. 2B shows an embodiment where the capacitance CX or CY is coupled to a common power. Although all possible variations are not explicitly shown in the Figures, the present technology covers all disclosed instances of the clock circuit showing the capacitance CX or CY, where the clock circuit is modified to couple the capacitance CX or CY to a common power.

In one embodiment, the capacitance CX or CY is actually a PMOS transistor with the opposite terminal decoupled from a common power with the inverters.

The inverter circuitry 204A and 204B is driven by a source of CTAT_power, or power that is conversely proportional to temperature, to decrease with increasing temperature.

The inverters are very different from the op amp version. In the op amp version, a Vref is compared against the timing circuit output (e.g., RC circuit rise/fall). But in the inverter version, the power of the inverter is controlled, to change the trip point of the inverter and thereby detect the timing circuit output (e.g., RC circuit rise/fall). In the inverter version, an additional temperature relationship between the power and the trip point of the inverter is of concern.

The inverters are advantageous over the op amp version, for one or more of the following reasons: (1) lower working VDD; (2) smaller circuit size (inverter has only 2 MOSFETs, but the op amp has 5 or more MOSFETs). (3) simpler design; (4) lower active current (inverter has one current path, but the op amp has 2 or 3 current paths and includes an extra current mirror); and (5) higher speed (inverter has one stage delay, the op amp has 2 or 3 stages of delay).

The latch circuitry 206 is cross-coupled, such that the output of one gate is coupled to the inputs of the other gate. One input of a gate is directly coupled to the output of another gate. Another input of a gate is directly coupled to the output of another gate through the timing circuitry and the level detection circuitry.

Figure 2C:
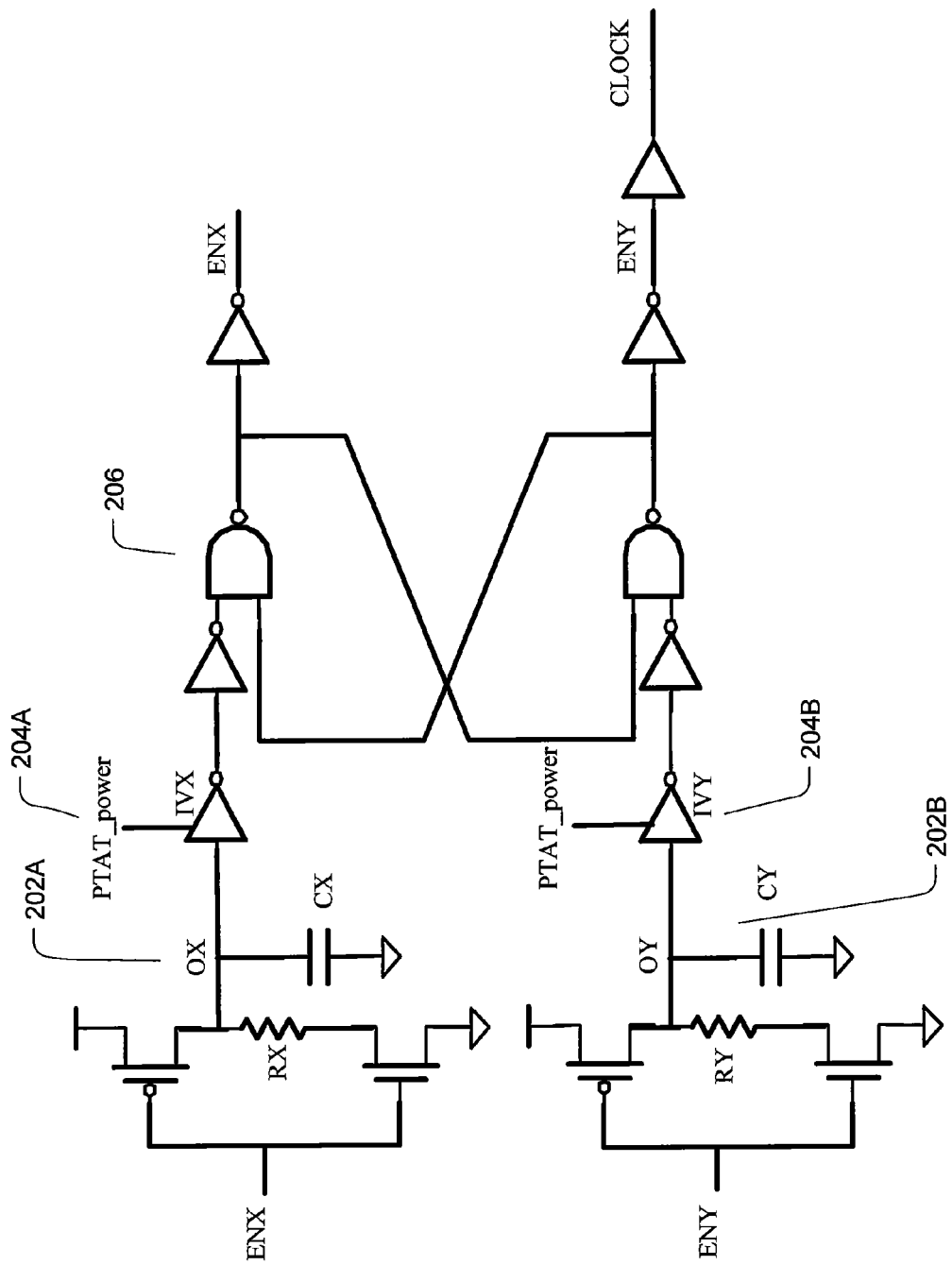
FIG. 2C is a circuit diagram of an integrated clock circuit with tolerance to temperature variations, similar to FIG. 2A, but receiving power from PTAT_power sources rather than CTAT power sources.

FIG. 2C shows another embodiment of a clock circuit. Although otherwise similar to FIG. 2A, in FIG. 2C the parallel instances of inverter circuitry 204A and 204B are driven by sources of PTAT_power, or power that is proportional to temperature, to increase with increasing temperature. Although all possible variations are not explicitly shown in the Figures, the present paper covers instances of the clock circuit showing a source of CTAT_power, where the source of CTAT_power is replaced with a source of PTAT_power.

Similarly, although all possible variations are not explicitly shown in the Figures, the present paper covers all disclosed instances of the clock circuit showing a source of PTAT_power, where the source of PTAT_power is replaced with a source of CTAT_power.

Figure 2D:
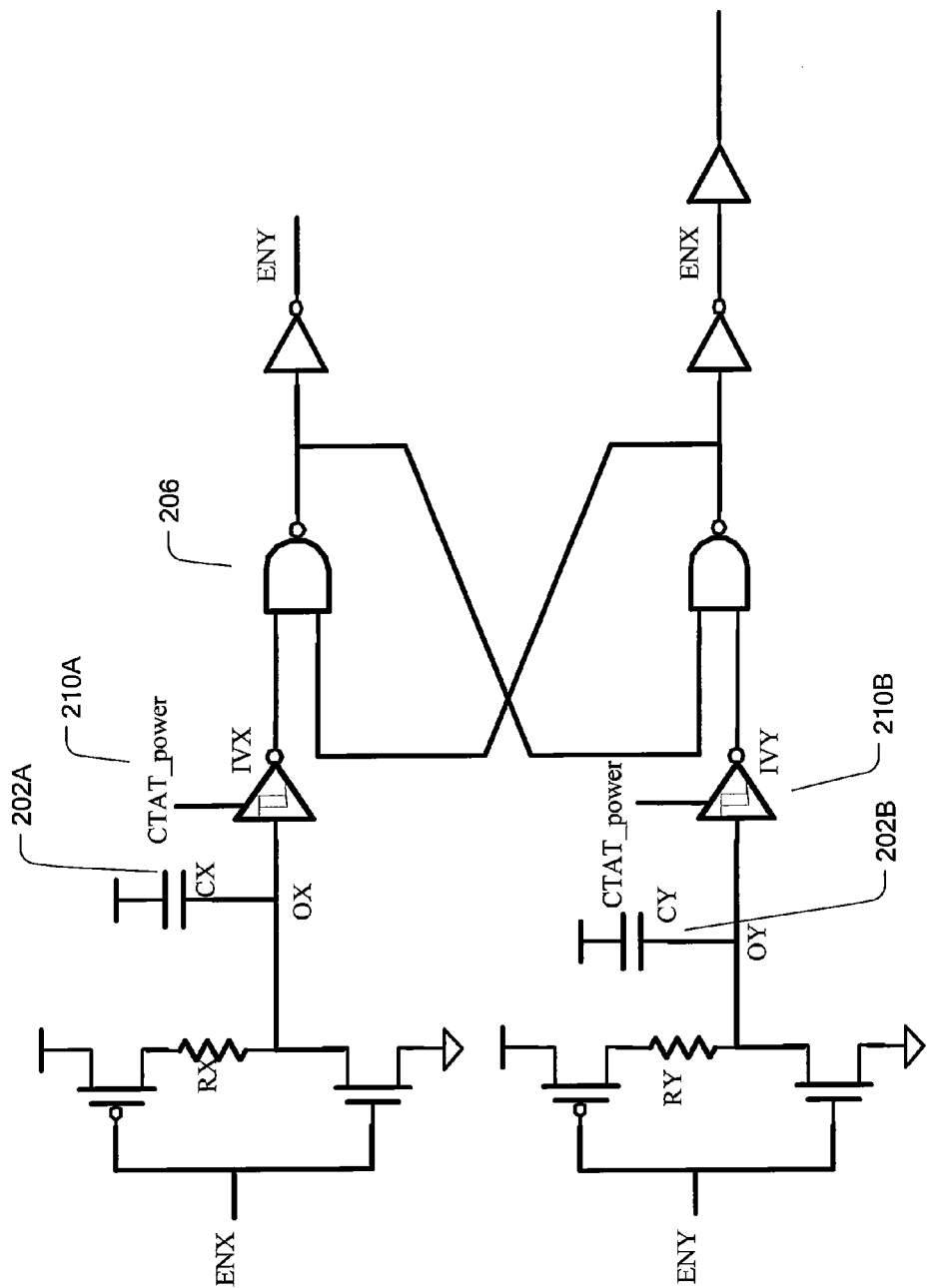
FIG. 2D is a circuit diagram of an integrated clock circuit with tolerance to temperature variations, including Schmitt trigger circuitry to perform level detection of the timing circuitry output.

FIG. 2D is a diagram of an integrated clock circuit with tolerance to temperature variations, including Schmitt trigger circuitry to evaluate the timing circuitry output.

Although similar to FIG. 2B, in FIG. 2D the level switching circuitry 210A and 210B are instances of a Schmitt trigger driven by a source of CTAT_power, and include op amps with closed loop positive feedback through resistance.

Figure 2E:
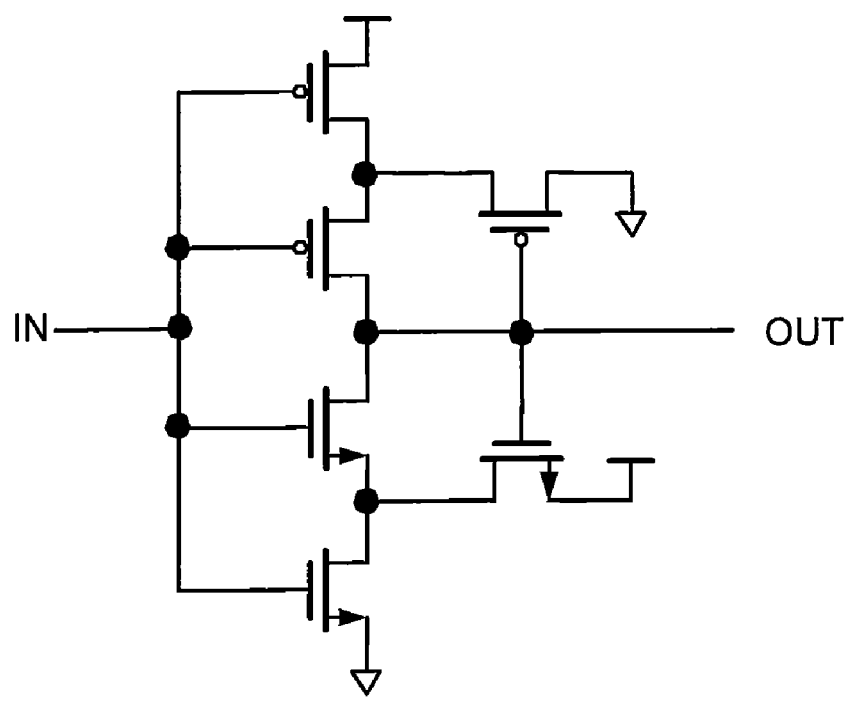
FIG. 2E is a circuit diagram of a Schmitt trigger, such as in FIG. 2D.

FIG. 2E is a diagram of a Schmitt trigger circuit.

Figure 3A:
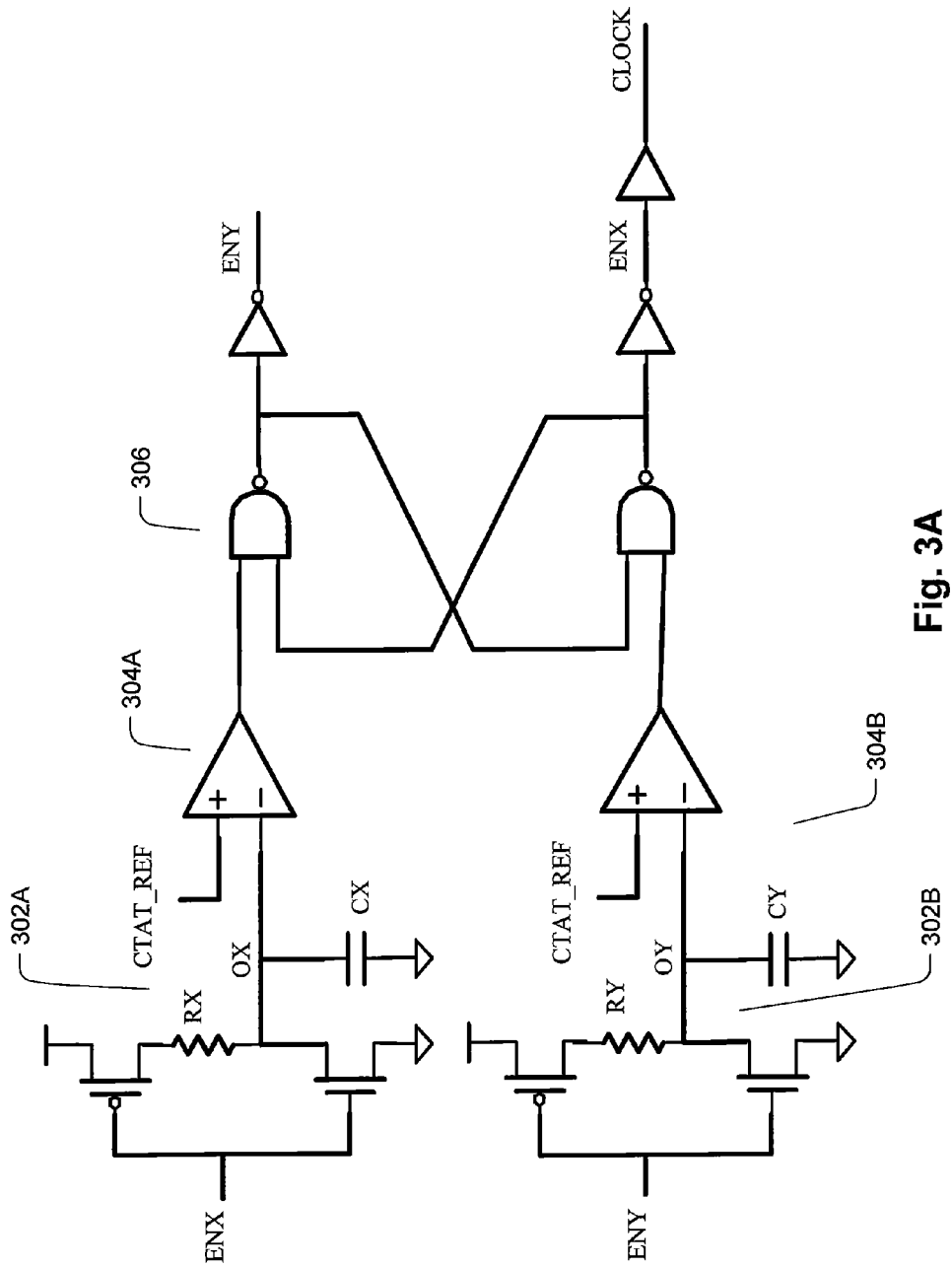
FIGS. 3A and 3B are circuit diagrams of an integrated clock circuit with tolerance to temperature variations, including op amp circuitry to perform level detection of the timing circuitry output, where FIG. 3A has capacitive timing circuitry coupled towards the ground, and FIG. 3B has capacitive timing circuitry coupled towards power.
Figure 3B:
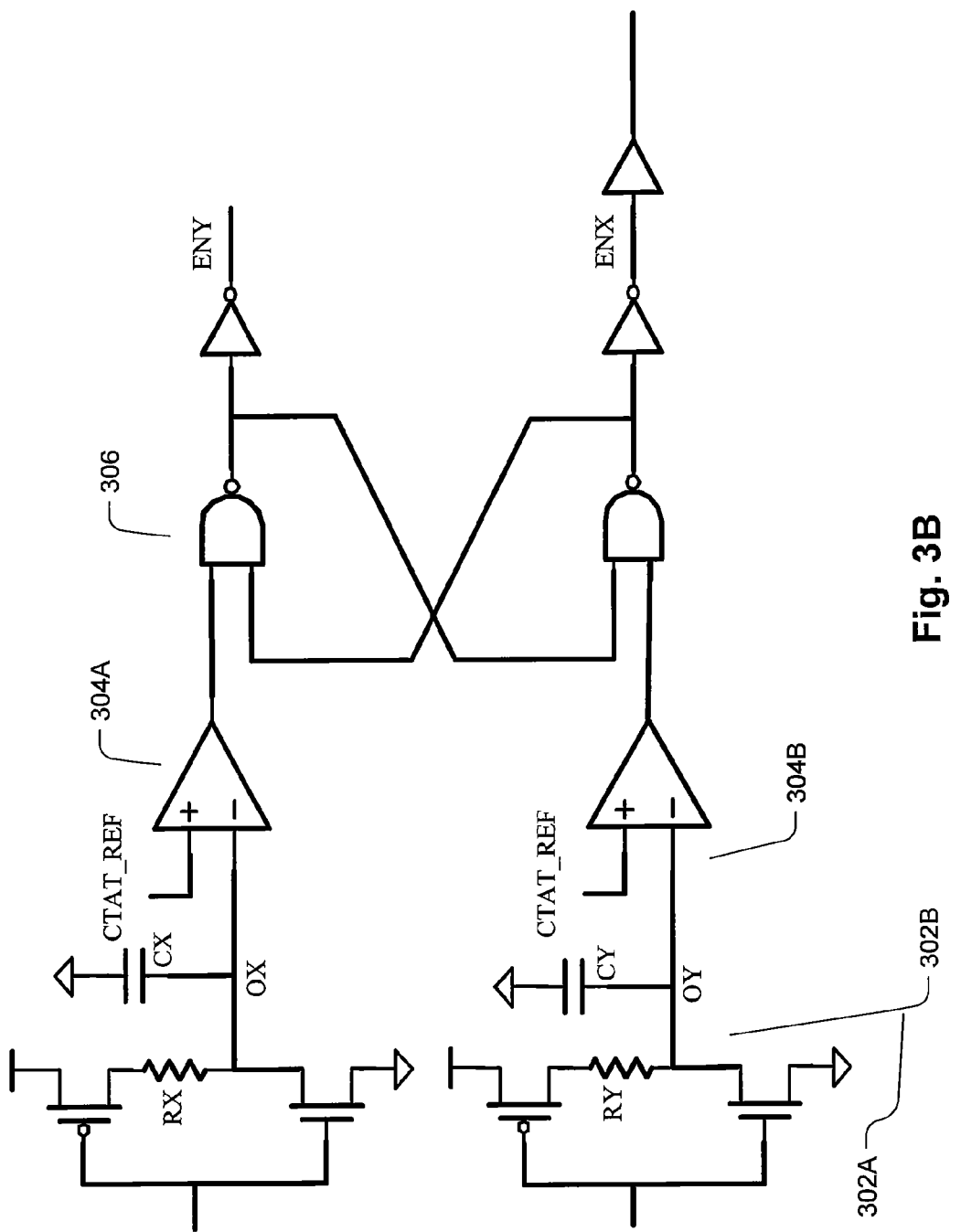

FIG. 3 is a circuit diagram of an integrated clock circuit with tolerance to temperature variations, including OP amp circuitry to perform level detection of the timing circuitry output by comparison with a reference.

Shown are parallel instances of timing circuitry 302A and 302B, parallel instances of level switching circuitry 304A and 304B, and the latch circuitry 306. The level switching circuitry 304A and 304B are OP amp comparator with a reference voltage CTAT_REF. Otherwise, the clock circuit is generally similar to FIG. 2A.

Figure 4A:
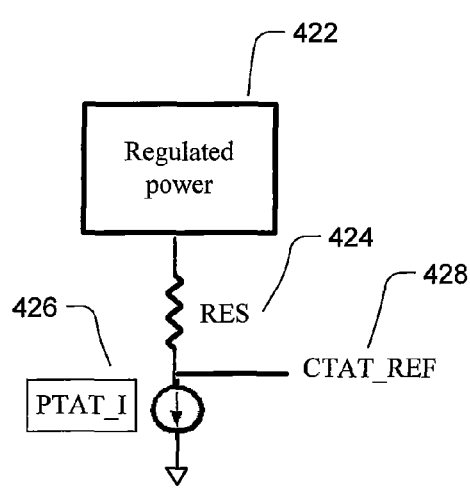
FIG. 4A is a circuit diagram of the circuit for the reference signal for the level detection circuitry including a PTAT current source, with output that decreases with increasing temperature

FIG. 4A is circuit diagram of the reference signal for the level detection circuitry, including a current source with current output that increases with increasing temperature.

FIG. 4A shows how the CTAT_power signal relied on by the level detection circuitry is generated, shown here as CTAT_REF 428. A constant current source PTAT_I 426, draws current that is proportional to temperature, to increase with increasing temperature, from regulated power 422 through resistor RES 424. The regulated power 422 supplies a constant voltage independent of varying temperature. The regulated power supplies a constant power and does not change with the VDD and temperature. An example is the output of a regulator with a bandgap reference. The resulting output is conversely proportional to temperature, due to the increasing voltage drop across the resistor with increasing temperature and the placement of the output terminal on the lower side of this voltage drop. An example of the current source is shown in FIG. 4E.

Figure 4B:
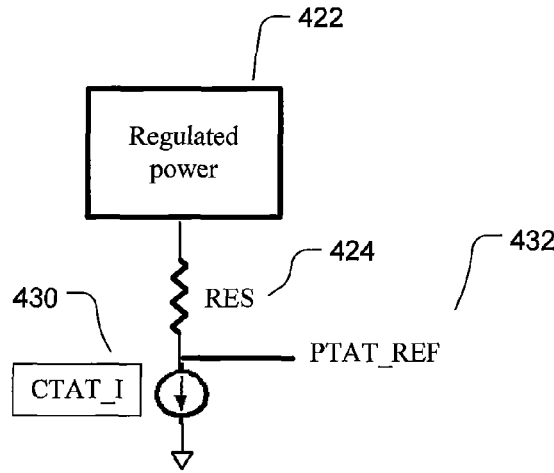
FIG. 4B is a circuit diagram of the circuit for the reference signal for the level detection circuitry including a CTAT current source, with output that increases with increasing temperature.

FIG. 4B is a variation of the circuit of FIG. 4A, where the constant current source PTAT_I 426 is replaced with the constant current source CTAT_I 430, and the CTAT_power signal CTAT_REF 428 relied on by the level detection circuitry is replaced with PTAT_power signal PTAT_REF 432 relied on by the level detection circuitry. An example of: the current source is shown in FIG. 4G.

Figure 4C:
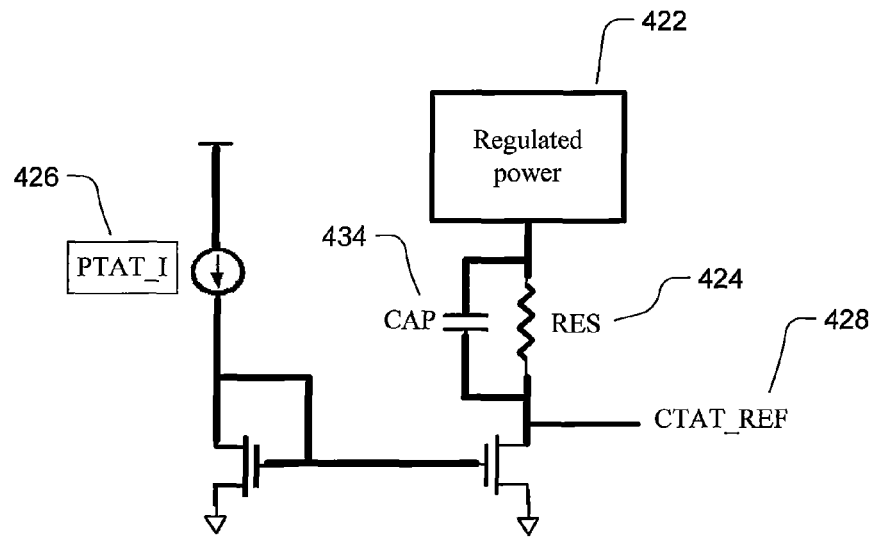
FIG. 4C is a circuit diagram of the circuit for the reference signal for the level detection circuitry including a current source, with output that increases with increasing temperature, and further including a capacitor in parallel with a load resistor of a current mirror.

FIG. 4C is a variation of the circuit of FIG. 4A, with a bypass capacitor 434 in parallel with resistor RES 424, which decreases the noise. Also, the current source includes a current mirror. An example of the current source circuit is shown in FIG. 4D.

Figure 4D:
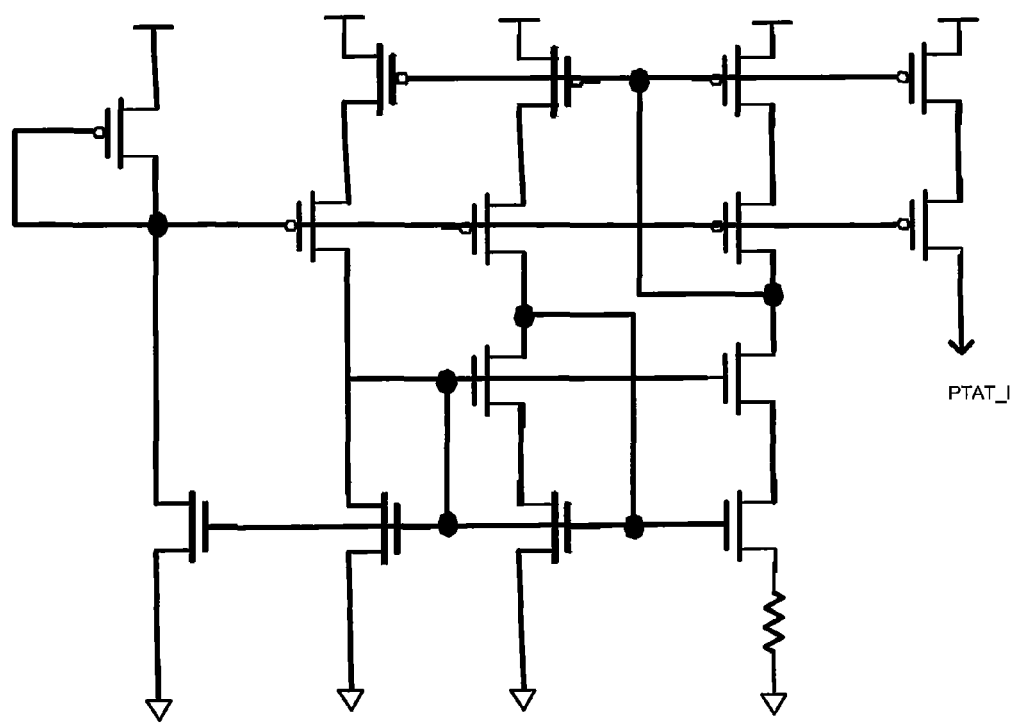
FIG. 4D is a current generator based reference circuit providing PTAT current from PMOS devices.
Figure 4E:
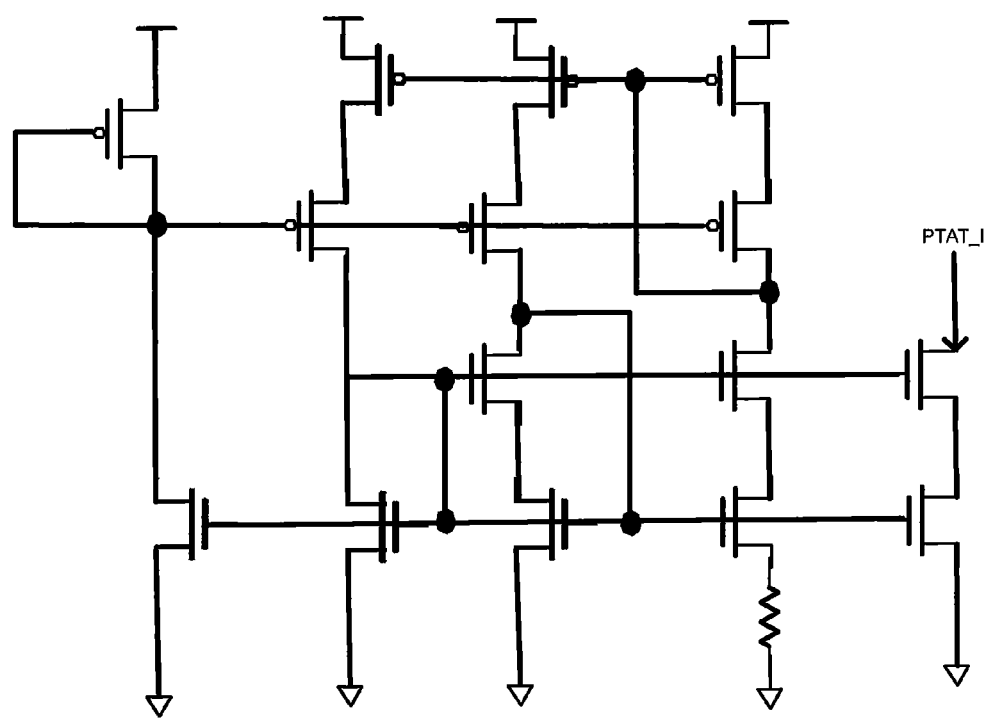
FIG. 4E is a current generator based reference circuit providing PTAT current from NMOS devices.

FIG. 4D is a current generator based reference circuit providing PTAT current from PMOS devices.

FIG. 4E is a current generator based reference circuit providing PTAT current from NMOS devices.

In FIGS. 4D and 4E, the circuit uses the delta_Vgs between two MOS transistors having the same current, proportional to temperature. So delta_Vgs/resistance=PTAT_I. In FIGS. 4D and 4E, these two transistors are identified with circles.

Figure 4F:
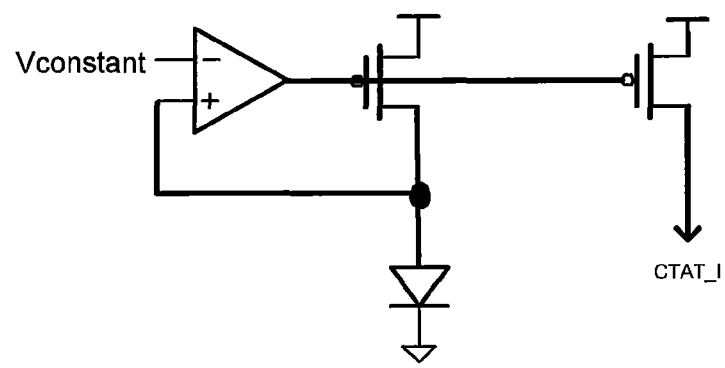
FIG. 4F is a current generator based reference circuit providing CTAT current from PMOS devices.
Figure 4G:
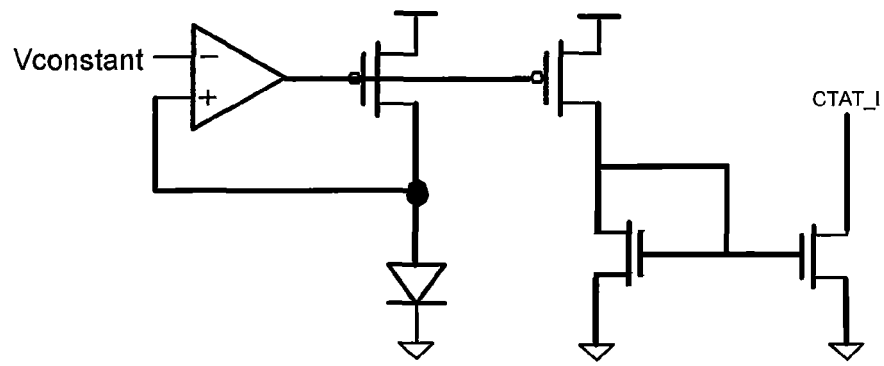
FIG. 4G is a current generator based reference circuit providing CTAT current from NMOS devices.

FIG. 4F is a current generator based reference circuit providing CTAT current from PMOS devices.

FIG. 4G is a current generator based reference circuit providing CTAT current from NMOS devices.

A current generator based reference circuit as described herein is advantageous, because in several embodiments, a single kind of temperature dependent parameter is controlled, instead of two kinds of temperature dependent parameters associated with different materials having different temperature dependence.

Figure 5A:
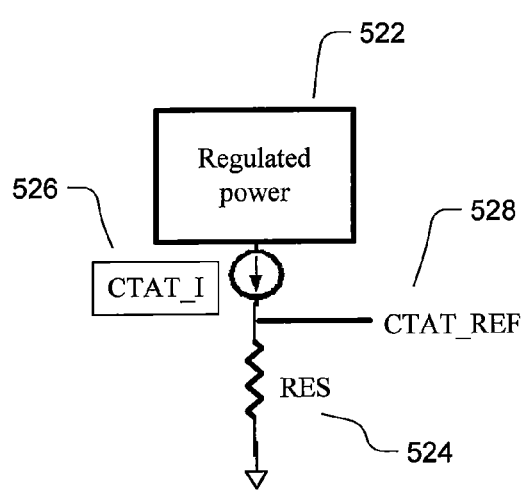
FIG. 5A is circuit diagram of the circuit for the reference signal for the level detection circuitry including a current source with current output that decreases with increasing temperature, and an output that decreases with increasing temperature.

FIG. 5A is circuit diagram of the reference signal for the level detection circuitry, including a current source with current output that decreases with increasing temperature.

FIG. 5A shows how the CTAT_power signal relied on by the level detection circuitry is generated, shown here as CTAT_REF 528. A constant current source CTAT_I 526, draws current that is conversely proportional to temperature, to decrease with increasing temperature, from regulated power 522 through resistor RES 524. The resulting output is conversely proportional to temperature, due to the decreasing voltage drop across the resistor with increasing temperature and the placement of the output terminal on the upper side of this voltage drop.

An example of the shown current sources is a cascade current source.

FIG. 5B, 5C, 5D, and 5E are other examples to generate the reference voltage signal.

Figure 5B:
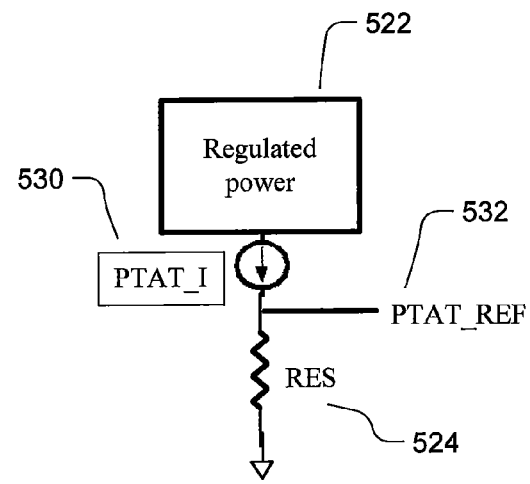
FIG. 5B is a circuit diagram of the circuit for the reference signal for the level detection circuitry including a current source with current output that increases with increasing temperature, with output that increases with increasing temperature.

FIG. 5B is a variation of the circuit of FIG. 5A, where the constant current source CTAT_I 526 is replaced with the constant current source PTAT_I 530, and the CTAT_power signal. CTAT_REF 528 relied on by the level detection circuitry is replaced with PTAT_power signal PTAT_REF 532 relied on by the level detection circuitry.

Figure 5C:
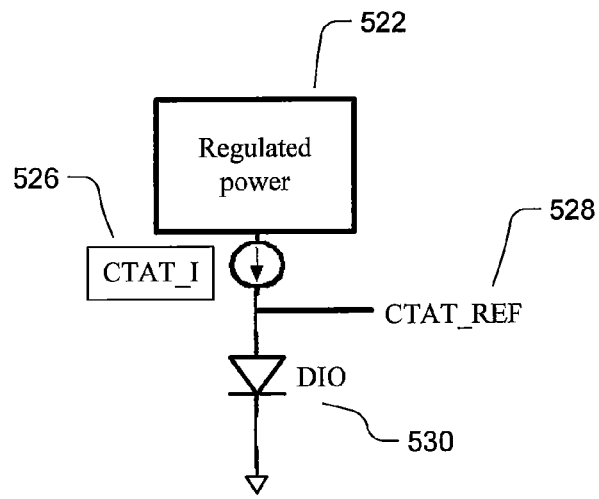
FIG. 5C is a circuit diagram of the circuit for the reference signal for the level detection circuitry including a current source with current output that decreases with increasing temperature, with output that increases with increasing temperature.

FIG. 5C is a variation of the circuit of FIG. 5A, where the resistor RES 524 is replaced with the diode DIO 530. An example of the current source is shown in FIG. 4F.

Figure 5D:
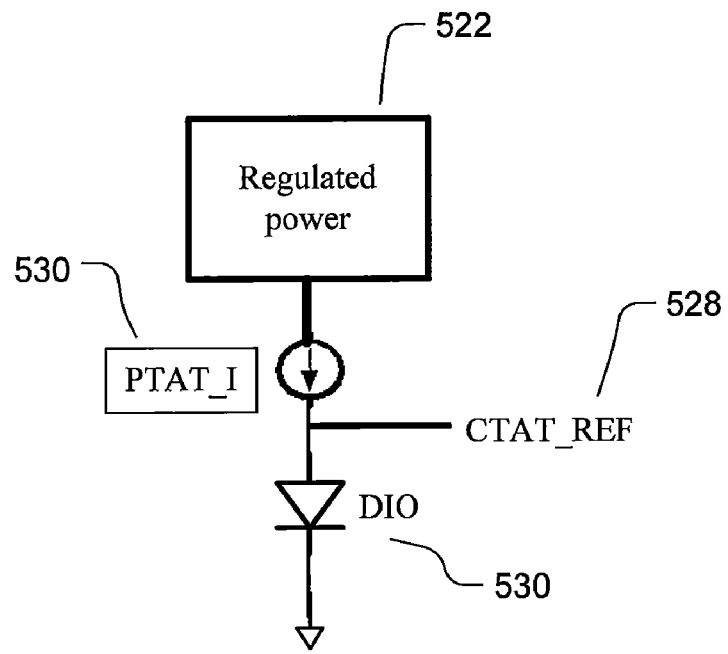
FIG. 5D is a circuit diagram of the reference signal for the level detection circuitry as in FIG. 5C, but including a current source with current output that increases with increasing temperature.

FIG. 5D is a variation of the circuit of FIG. 5C, where the constant current source CTAT_I 526 is replaced with the constant current source PTAT 1530, and the placement of the output terminal is moved from the upper side of the voltage drop across the constant current source, to the lower side of the voltage drop across the constant current source.

Figure 5E:
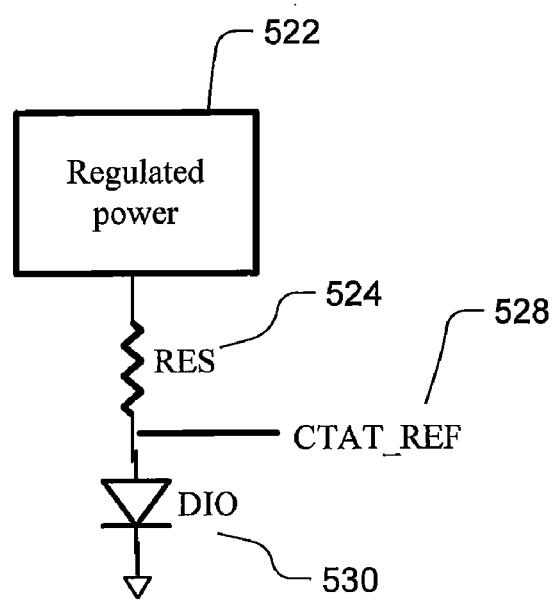
FIG. 5E is a variation of the circuit of FIG. 5C, where the constant current source replaced with the resistor.

FIG. 5E is a variation of the circuit of FIG. 5C, where the constant current source CTAT_I 526 is replaced with the resistor RES 524.

Figure 6A:
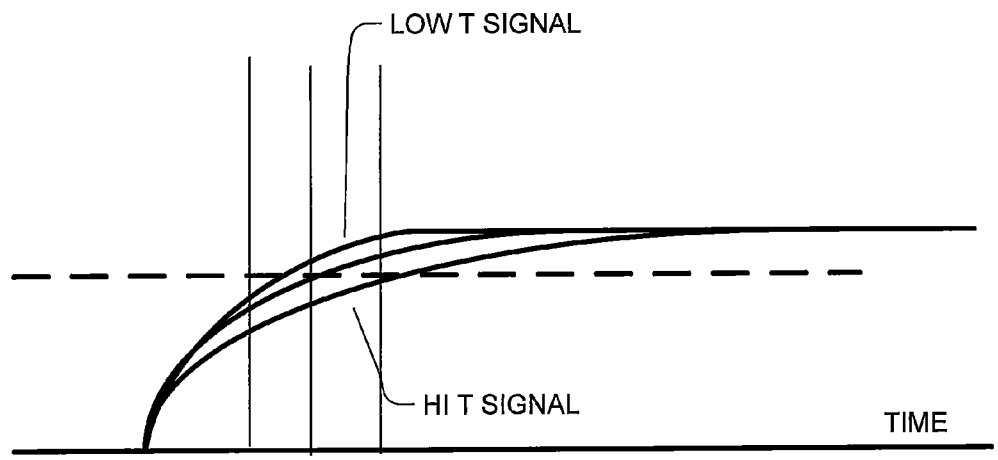
FIG. 6A is a set of graphs of time versus rising magnitude traces showing how clock circuitry that is intolerant of temperature variation generates clock timing that varies widely with varying temperature.

FIG. 6A is a set of graphs of time versus magnitude traces showing how clock circuitry that is intolerant of temperature variation generates clock timing that varies widely with varying temperature.

FIG. 6A shows a range of traces at high temperature, low temperature, and intermediate temperature. The lower the temperature, the faster the timing circuitry becomes, and the higher the temperature, the slower the timing circuitry becomes. Due to the common timing circuitry reference, the timing circuitry reaches the reference more quickly at low temperature than at high temperature. Consequently, the timing of the clock circuitry is faster at low temperature than at high temperature.

Figure 6B:
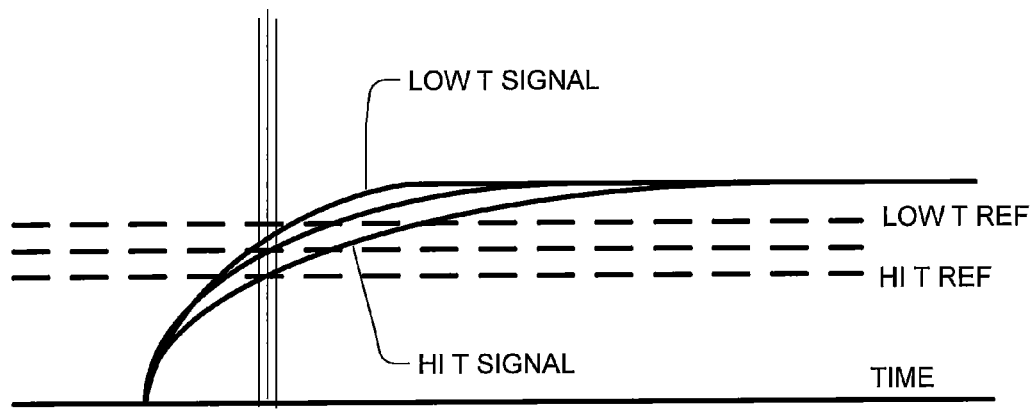
FIG. 6B is a set of graphs of time versus rising magnitude traces showing how clock circuitry that is tolerant of temperature variation generates clock timing is fairly constant with varying temperature, due to circuitry such as that in FIGS. 2-5.

FIG. 6B is a set of graphs of time versus magnitude traces showing how clock circuitry that is tolerant of temperature variation generates clock timing is fairly constant with varying temperature, due to circuitry such as that in FIGS. 2-5.

FIG. 6B shows a range of traces at high temperature, low temperature, and intermediate temperature. As in FIG. 6A, the lower the temperature, the faster the timing circuitry becomes, and the higher the temperature, the slower the timing circuitry becomes. However, different timing circuitry references are used in FIG. 6B, in contrast with the common timing circuitry reference used in FIG. 6A. Although the timing circuitry reaches the reference more quickly at low temperature than at high temperature, the timing circuitry reference is also correspondingly higher. Consequently, the timing of the clock circuitry shows little variation despite the temperature variation and resulting speed variation in the timing circuitry.

Figure 7A:
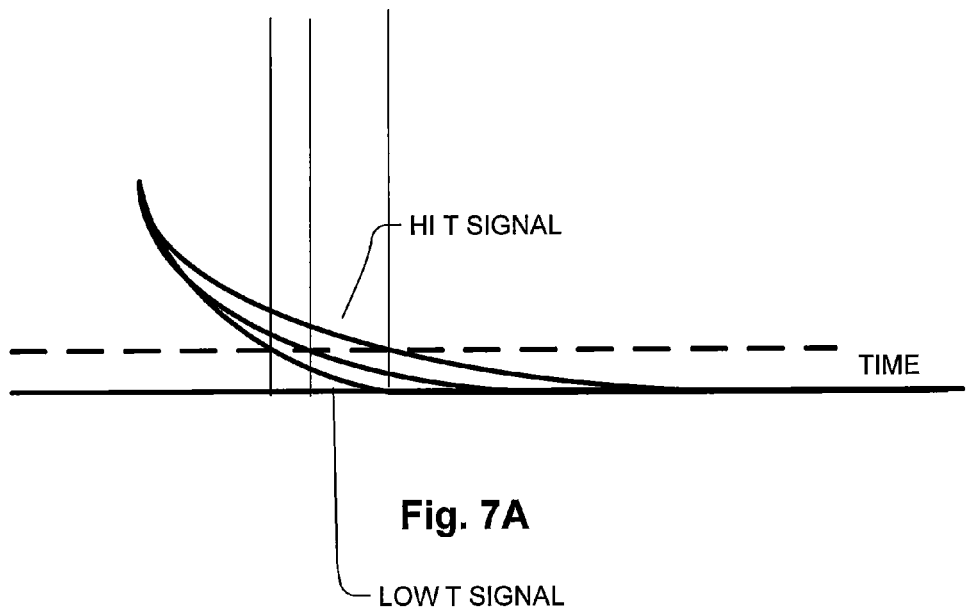
FIG. 7A is a set of graphs of time versus falling magnitude traces showing how clock circuitry that is intolerant of temperature variation generates clock timing that varies widely with varying temperature.
Figure 7B:
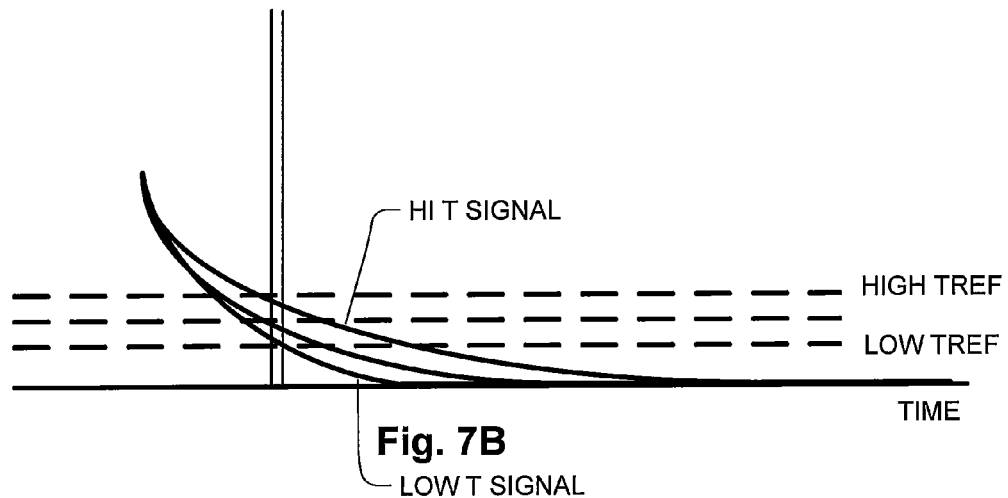
FIG. 7B is a set of graphs of time versus falling magnitude traces showing how clock circuitry that is tolerant of temperature variation generates clock timing is fairly constant with varying temperature, due to circuitry such as that in FIGS. 2-5.

FIGS. 7A and 7B are other embodiments, which show falling signals rather the rising signals of FIGS. 6A and 6B, but still show the same time constants.

Whether a clock signal relies on rising signals such as FIGS. 6A and 6B, or falling signals such as FIGS. 7A and 7B, depends on whether the capacitance CX and CY is coupled towards ground as in FIG. 2A or towards power as in FIG. 2B.

Figure 8A:
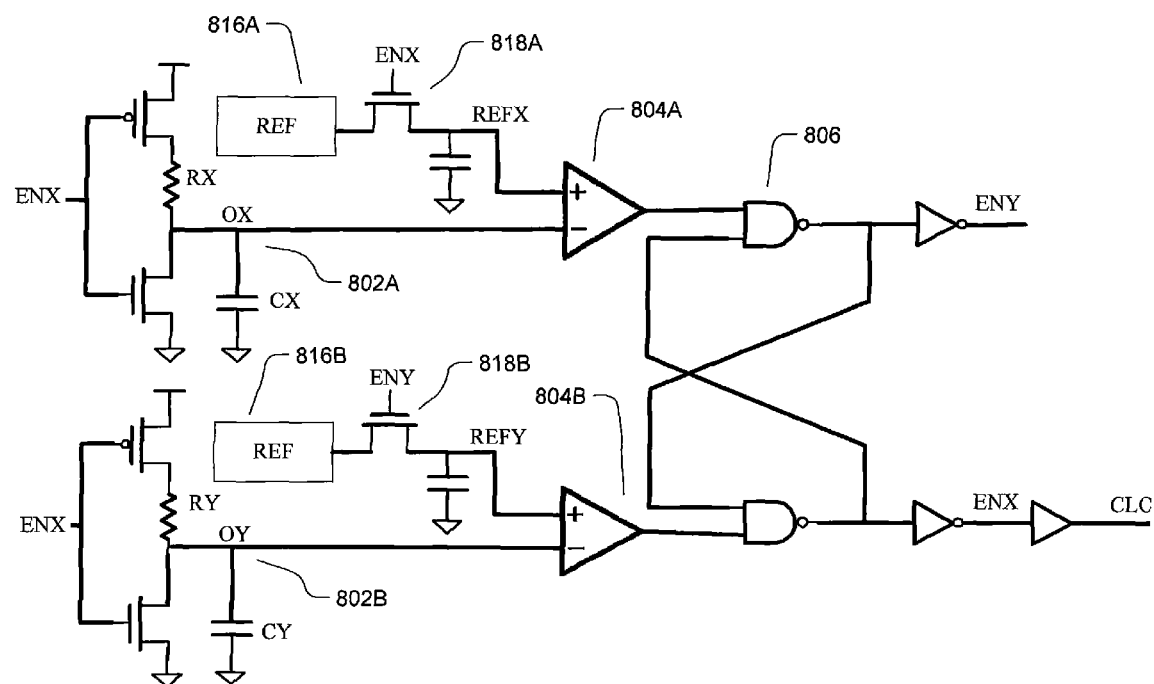
FIGS. 8A and 8B are circuit diagrams of an integrated clock circuit with tolerance to ground noise, including transistors that selectively couple the ground noise as part of the reference signal used in level detection of the timing circuitry output, where in FIG. 8A the switching reference circuitry include capacitance circuitry coupled towards ground, and in FIG. 8B the switching reference circuitry includes capacitance circuitry coupled towards power.
Figure 8B:
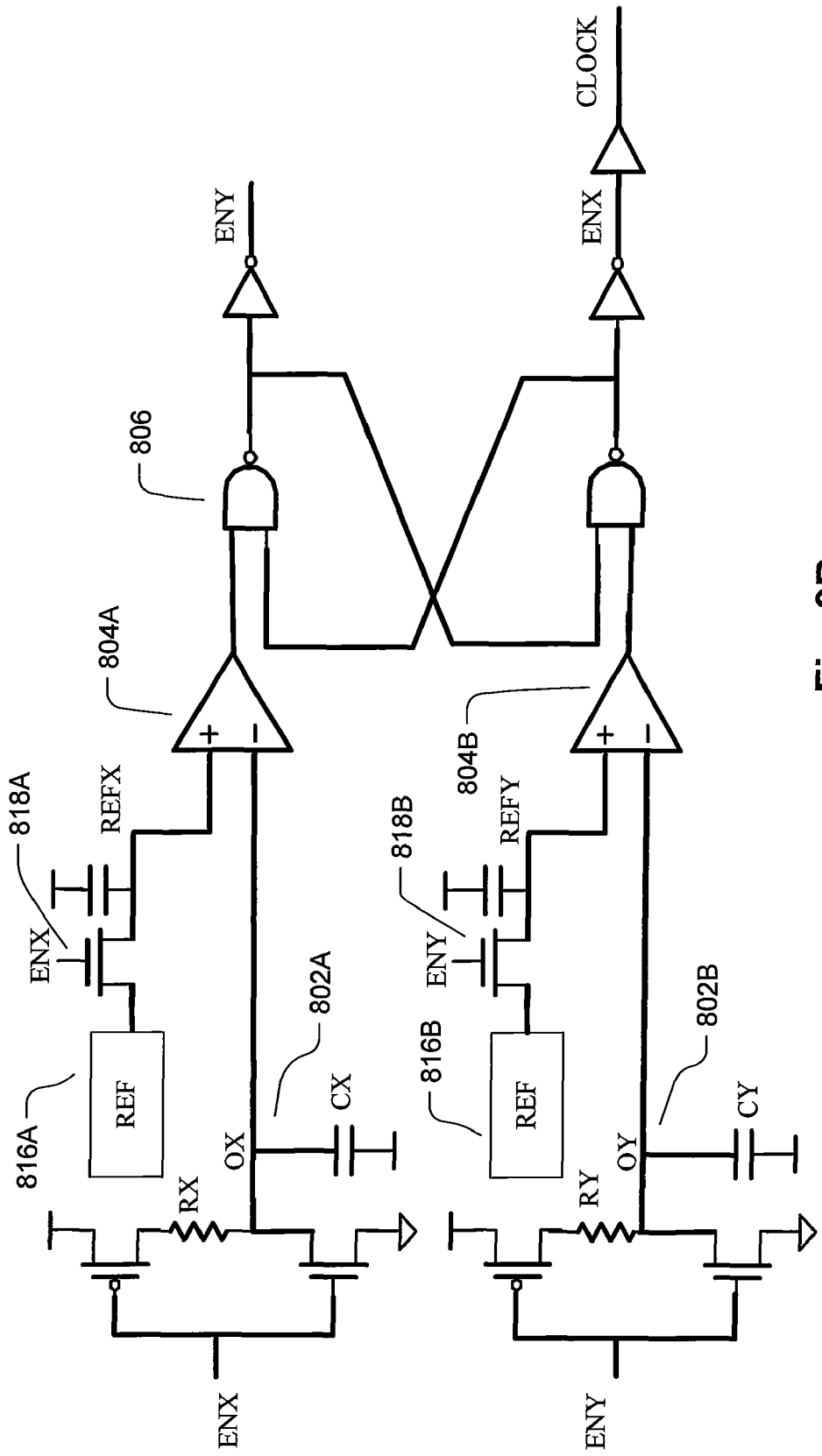

FIGS. 8A and 8B are circuit diagrams of an integrated clock circuit with tolerance to ground noise, including transistors that selectively couple the ground noise as part of the reference signal used in level detection of the timing circuitry output.

Shown are parallel instances of timing circuitry 802A and 802B, parallel instances of level switching circuitry 804A and 804B, and the latch circuitry 806. The level switching circuitry 804A and 804B selectively couples the ground noise coming from the level switching reference circuitry 816A or 816B, and is stored in the capacitive node REF X or REFY, respectively subject to the switching action of the switching transistor 818A turned on by signal ENX and the switching transistor 818B turned on by signal ENY. This acts as a sample and hold of ground noise, so that the same ground noise is held by the timing circuitry 802A or 802B, and by the level switching reference circuitry reference nodes REFX or REFY, relied on by the level switching circuitry 104.

In one embodiment, the capacitance CX or CY is actually a PMOS transistor with the opposite terminal decoupled from a common power with the PMOS which connects to the RX or RY OX is kept at ground when ENX is high. Then ENX goes low and turns off the NMOS; at this moment the ground noise is held in the OX. If the noise is high then the pre-charge speed is fast; if the noise is low then the pre-charge speed is slow. This circuit lets the REFX or REFY hold the same ground noise at the same time.

In FIG. 8A the switching reference circuitry reference nodes REFX or REFY, includes capacitance circuitry coupled towards ground. In FIG. 8B the switching reference circuitry reference nodes REFX or REFY, includes capacitance circuitry coupled towards power.

In various embodiments, the level switching reference circuitry 816A or 816B are two sets of circuitry, or the same set of circuitry shared by the multiple parallel instances of timing circuitry and the multiple level switching circuitry 804A and 804B.

FIG. 9 is a set of graphs of voltage versus time, showing how clock circuitry that is intolerant of ground noise, will generate clock timing that varies widely with time-varying ground noise.

FIG. 9 shows how traces OX and OY are affected by ground noise, in this case the REF_LO signal. When there is a peak in ground noise, then the process of the timing circuit charging from REF_LO to REF_HI gets a head start, resulting in less time being required for the timing circuit to charge from REF_LO to REF_HI. Accordingly, the resulting clock signal output 910 has a wide variation in clock period.

When ENX goes high, the OX is kept at ground and the voltage varies with the ground noise. When ENX goes low, and turns off the NMOS, then the ground noise is kept at the OX. But the reference level still varies with the ground noise without more. The worse case is that OX holds a high ground noise and during the charging period the reference circuit suffer a negative ground level; then the reference is much lower than expected. So a sample and hold like structure keeps the same ground noise in the REFX or REFY.

Figure 10:
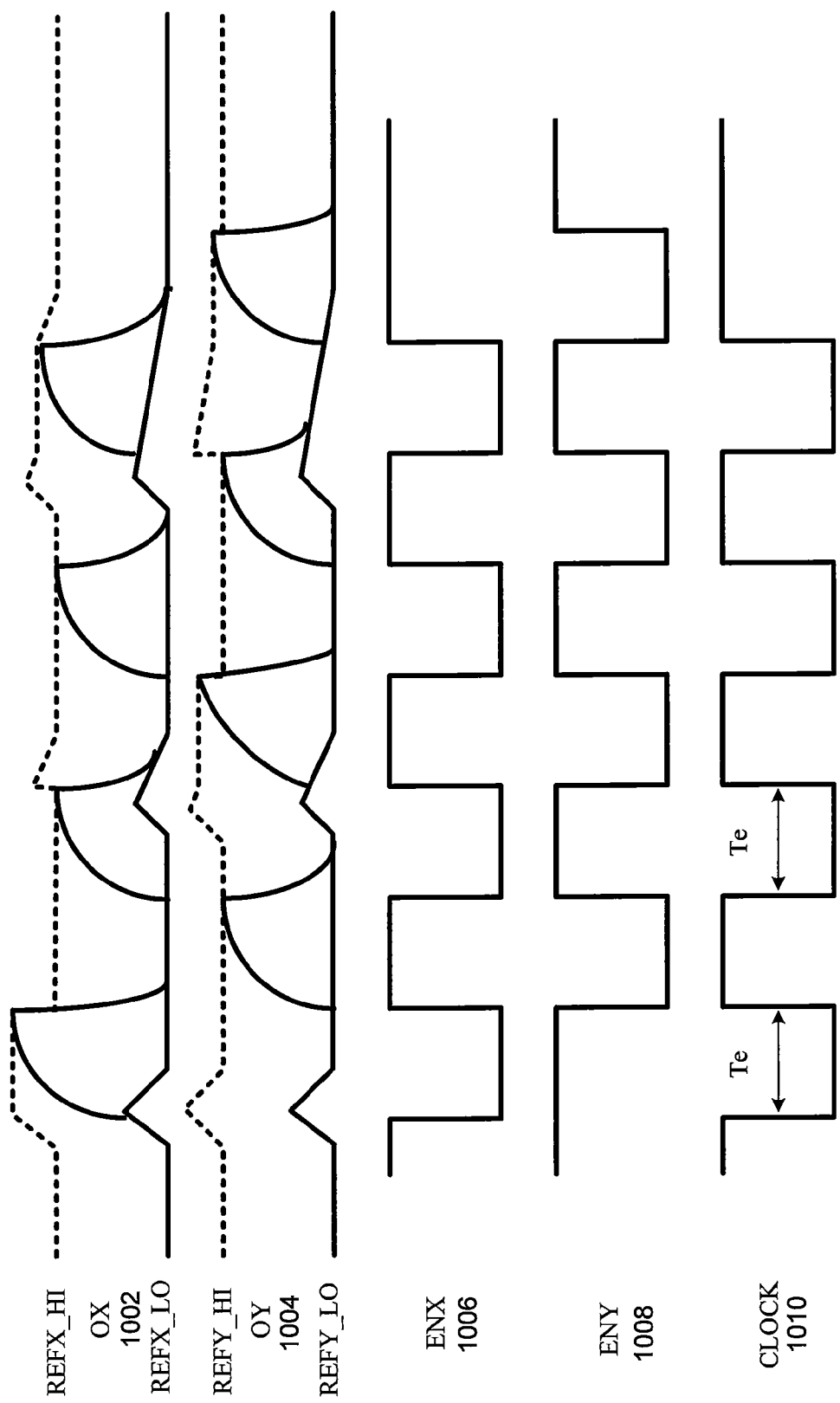
FIG. 10 is a set of graphs of voltage versus time, showing how clock circuitry that is tolerant of ground noise, will generate clock timing that is fairly constant with time-varying ground noise, due to circuitry such as that in FIG. 8.

FIG. 10 is a set of graphs of voltage versus time, showing how clock circuitry that is tolerant of ground noise, will generate clock timing that is fairly constant with time-varying ground noise, due to circuitry such as that in FIG. 8.

FIG. 10 shows how traces OX and OY are affected by ground noise, in this case the REF_LO signal. When there is a peak or other variation in ground noise, this peak or other variation is stored in the respective capacitor for REFX or REFY of FIG. 8. Because ground noise affecting REF_LO is tracked by this sample-and-hold reference circuitry, the level detection circuitry compares the same ground noise from the level detection reference circuitry, and the timing circuitry. After the ground noise is sampled and held in this manner, the ground noise, which continued to change, is decoupled from the sampling circuitry. Accordingly, in the process of the timing circuit charging from REF_LO to REF_HI, there is no "head start", and the same time is required for the timing circuit to charge from REF_LO to REF_HI, despite the ground noise. Accordingly, the resulting clock signal output 910 has a common clock period during a wide variation in ground noise.

Another embodiment is directed to sampling the ground noise and then decoupling the ground noise from the sampling circuitry during discharging, rather than decoupling the ground noise from the sampling circuitry during charging as in FIGS. 9 and 10. This embodiment carries the additional difficulty of having to address power noise from the noise regulator power.

In another embodiment (like FIG. 2C), the sample and hold circuit will hold the power noise instead of the ground noise.

Figure 11A:
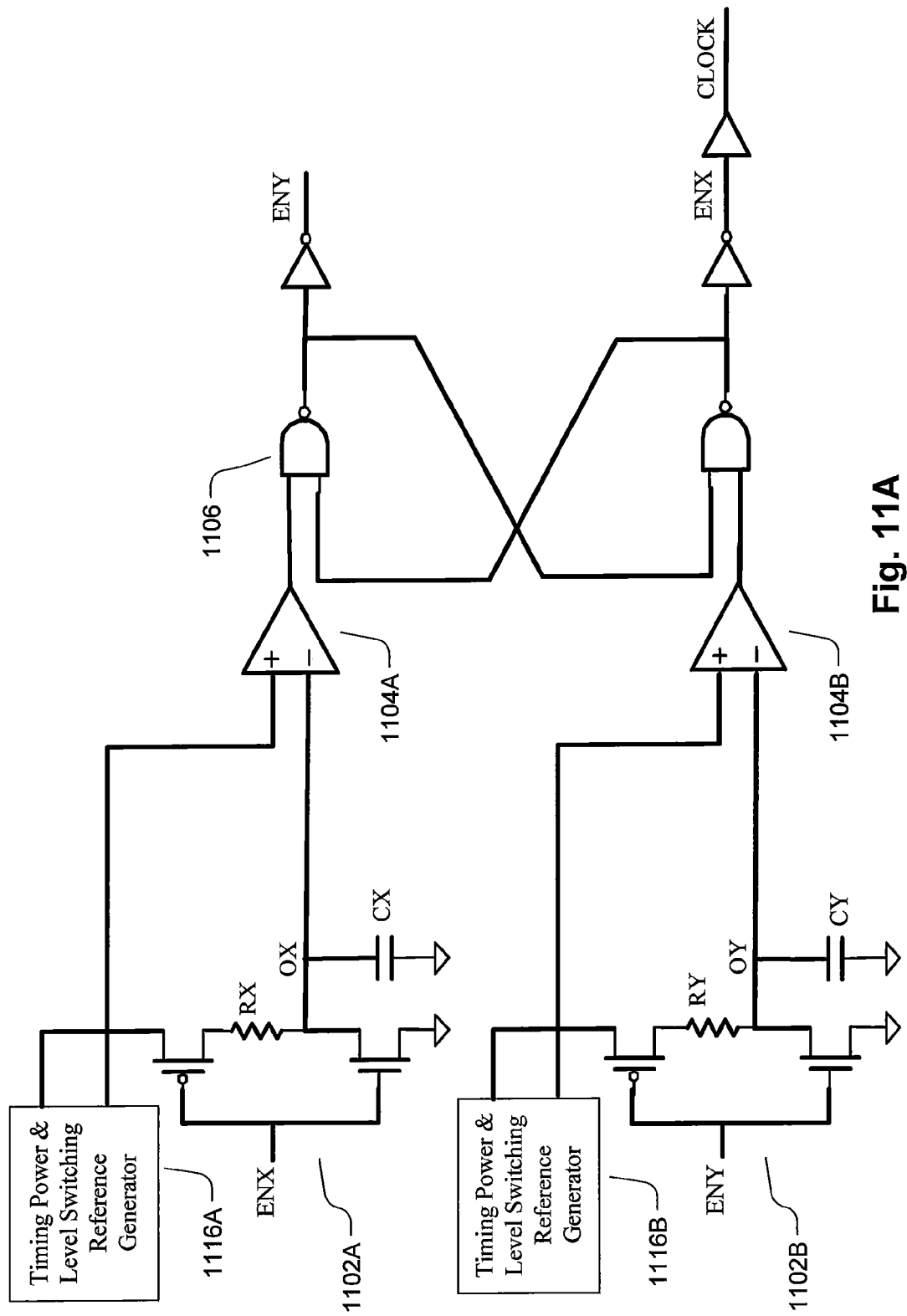
FIGS. 11A and 11B are circuit diagrams of an integrated clock circuit with tolerance to power noise, including transistors that share a common noise phase of power noise in the timing circuitry power, and power noise in the reference signal used in level detection of the timing circuitry output, where in FIG. 11A the capacitance circuitry is coupled towards ground, and in FIG. 11B the capacitance circuitry is coupled towards power.
Figure 11B:
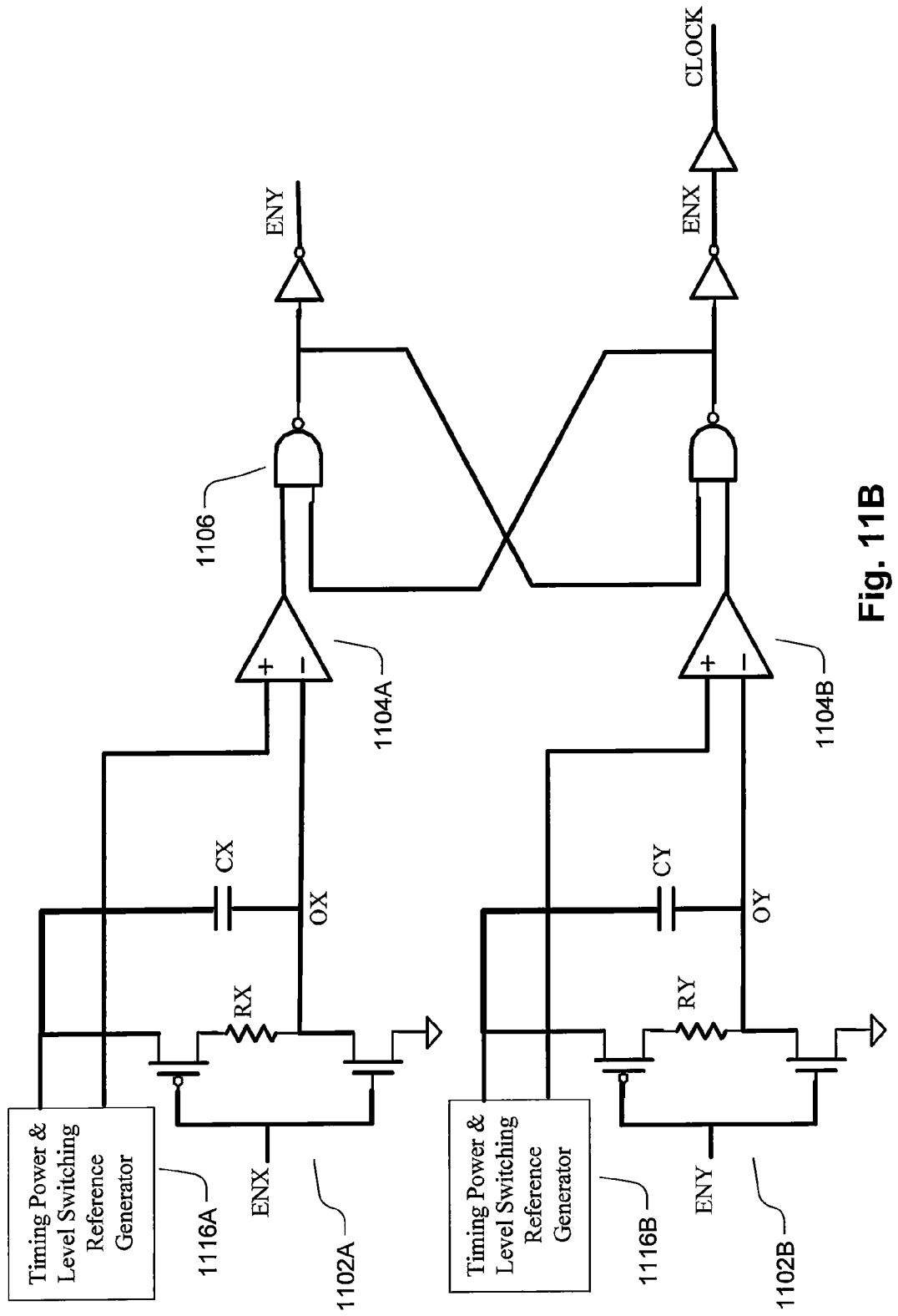

FIGS. 11A and 11B are circuit diagrams of an integrated clock circuit with tolerance to power noise, including transistors that share a common noise phase of power noise in the timing circuitry power, and power noise in the reference signal used in level detection of the timing circuitry output.

Shown are parallel instances of timing circuitry 1102A and 1102B, parallel instances of level switching circuitry 1104A and 1104B, and the latch circuitry 1106. Also shown are parallel instances of timing power and level switching generator 1116A and 1116B, which generate power noise with the same noise phase in both the power noise in the timing circuitry power, and the power noise in the reference signal used in level detection of the timing circuitry output.

In FIG. 11A the capacitance circuitry CX or CY is coupled towards ground. In FIG. 11B the capacitance circuitry CX or CY is coupled towards power 1116A or 1116B.

Figure 12:
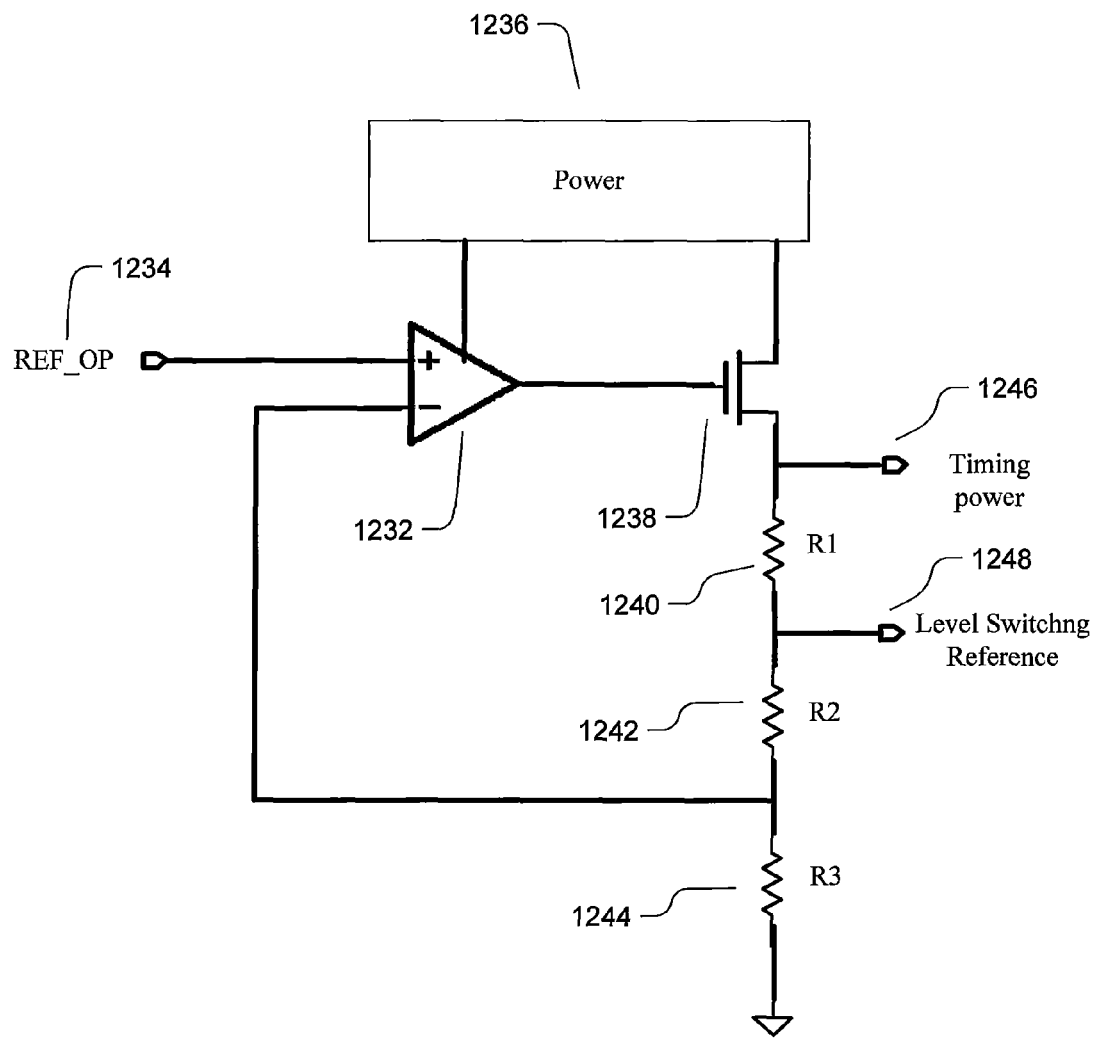
FIG. 12 is a circuit diagram of the power circuitry that shares the common noise phase of power noise to in the timing circuitry power, and power noise to in the reference signal used in level detection of the timing circuitry output.

FIG. 12 is a circuit diagram of the power circuitry that shares the common noise phase of power noise in the timing circuitry power, and power noise in the reference signal used in level detection of the timing circuitry output.

FIG. 12 shows a power source 1236, driving an op amp 1232. The op amp has a reference signal REF_OP 1234 in the noninverting input. An example of REF_OP 1234 is a bandgap reference circuit at 1.3 V. A MOFET 1238 has a gate coupled to the output of op amp 1232, a drain coupled to the power source 1236, and a source coupled to the timing power output 1246. The timing power output 1246 is separated by resistor R1 1240 from the level switching reference 1248. Resistor R2 1242 separates the level switching reference 1248 from the negative feedback point of the op amp 1232. Finally, resistor R3 couples this feedback point to ground.

Another embodiment employs capacitive coupling with a floating node to maintain the same noise phase between the timing power output 1246 and the level switching reference 1248, where one of the timing power output 1246 and the level switching reference 1248 is floating.

Although the above embodiments are specifically designed to maintain the same noise phase between the timing power output 1246 and the level switching reference 1248, this is not the case in other designs. Such other designs have different noise phase between the timing power output and the level switching reference 1248, for one or more various reasons: (1) the reference circuit is not near the timing circuit due to the chip plan; (2) the reference circuit is a regulator which has better PSRR (power supply rejection ratio) than VDD power; and (3) even with a power regulator for the RC power, a noise phase difference remains, due to the different output loading and transient, and the power regulator having to support larger current and larger output transient.

Figure 13:
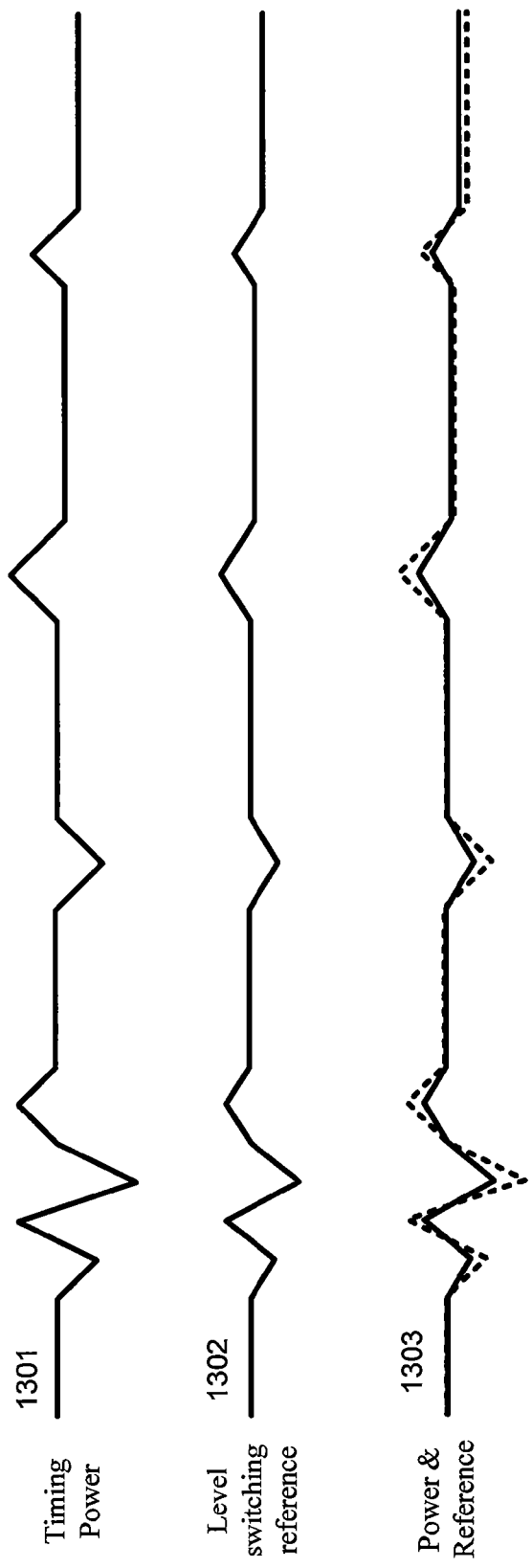
FIG. 13 is a set of graphs of voltage versus time, showing how power noise has the same phase in both the timing circuitry power, and the reference signal used in level detection of the timing circuitry output, due to circuitry such as in FIGS. 11 and 12.

FIG. 13 is a set of graphs of voltage versus time, showing how power noise has the same phase in both the timing circuitry power, and the reference signal used in level detection of the timing circuitry output, due to circuitry such as in FIGS. 11 and 12.

The same noise phase is shown in both the power noise in the timing circuitry power 1301, and the power noise in the reference signal used in level detection of the timing circuitry output 1302. Trace 1303 overlaying traces 1301 and 1302 show that, although the magnitudes of the power noise vary, the peaks and valleys are synchronous in the power noise between traces 1301 and 1302.

Figure 14:
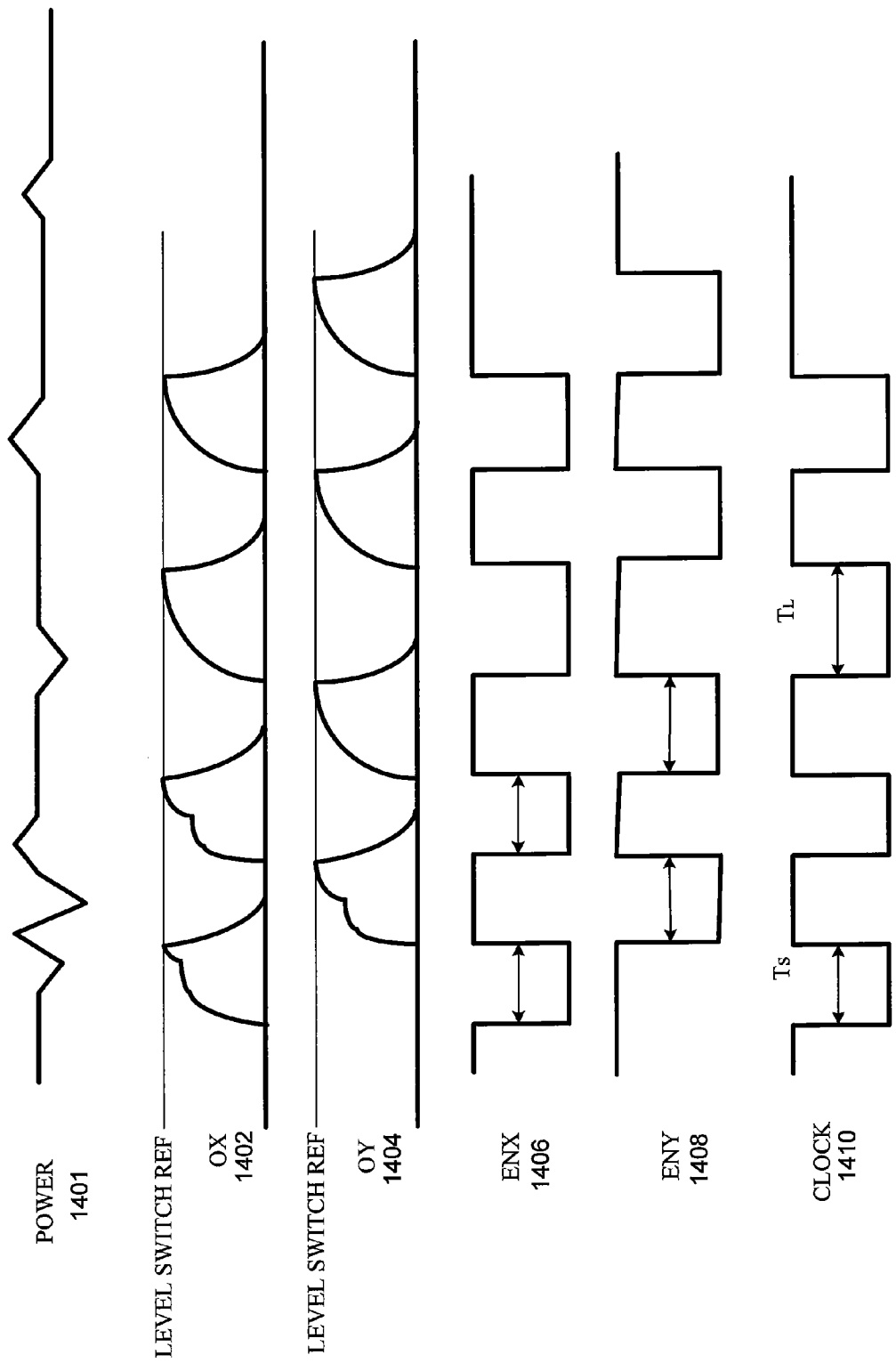
FIG. 14 is a set of graphs of voltage versus time, showing how clock circuitry that is intolerant of power noise, will generate clock timing that varies widely with time-varying power noise.

FIG. 14 is a set of graphs of voltage versus time, showing how clock circuitry that is intolerant of power noise, will generate clock timing that varies widely with time-varying power noise.

FIG. 14 shows how traces OX and OY are affected by power noise 1401. When there is a dip in power noise, then the process of the timing circuit charging from REF_LO to REF_HI gets a head start, resulting in less time being required for the timing circuit to charge from REF_LO to REF_HI. Similarly, when there is a peak in power noise, then the process of the timing circuit charging from REF_LO to REF_HI gets slowed, resulting in more time being required for the timing circuit to charge from REF_LO to REF_HI. These variations follow from the constant level switching reference. Accordingly, the resulting clock signal output 1410 has a wide variation in clock period.

FIG. 15 is a set of graphs of voltage versus time, showing how clock circuitry that is tolerant of power noise, will generate clock timing that is fairly constant with time-varying power noise, due to circuitry such as that in FIGS. 11 and 12.

FIG. 15 shows how traces OX and OY are affected by ground noise. Unlike in FIG. 14, when there is a peak or other variation in power noise 1501, there is a a synchronous has peak or other variation in the level switching reference. Although the magnitude of these peaks or other variations are lessened in the level switching reference, as compared to that of the power noise, the synchronous nature of the power noise between the timing circuitry power 1501 and the level switching reference substantially decreases the clock signal variation. Accordingly, the resulting clock signal output 1510 has a common clock period during a wide variation in ground noise.

Figure 16A:
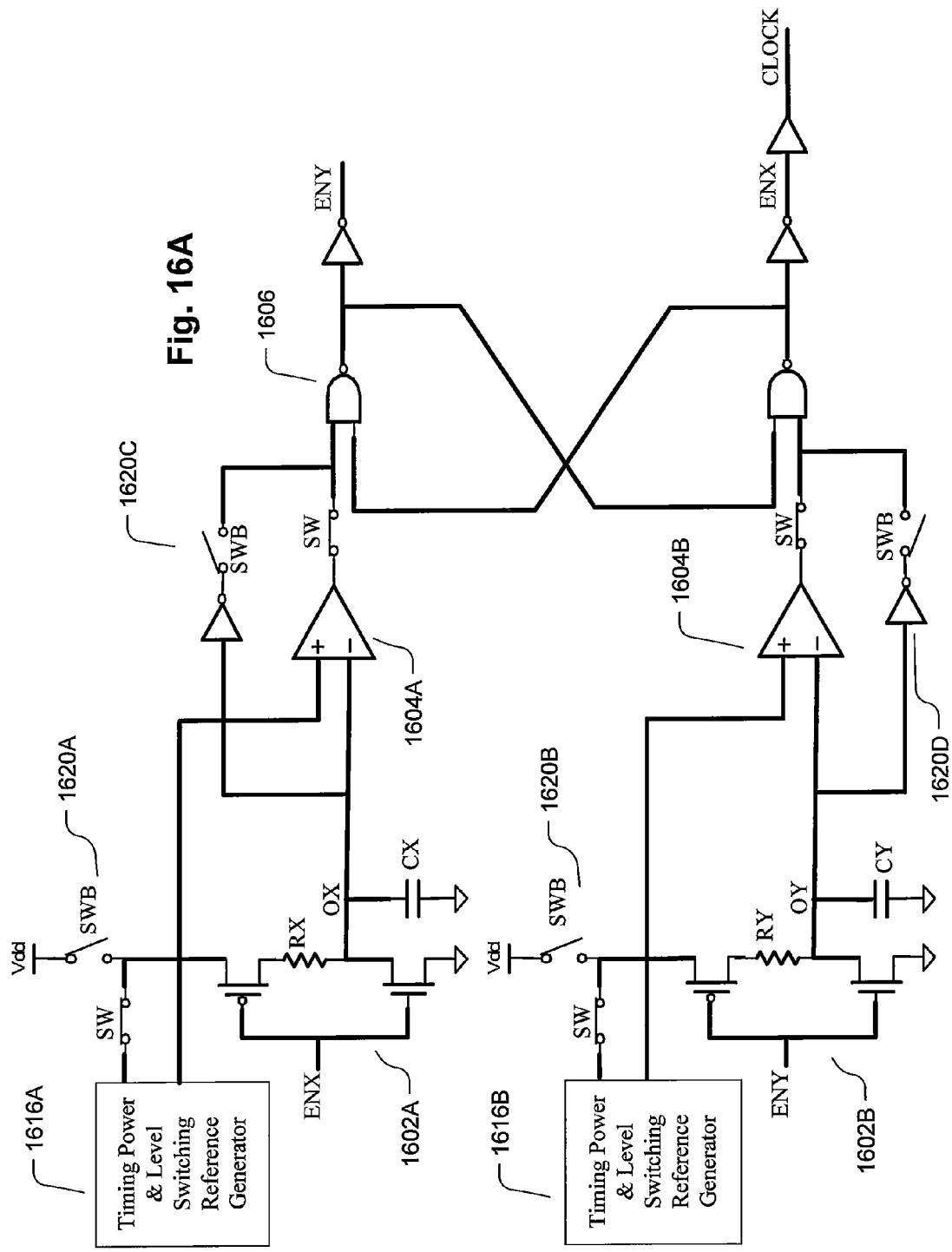
Figure 16B:
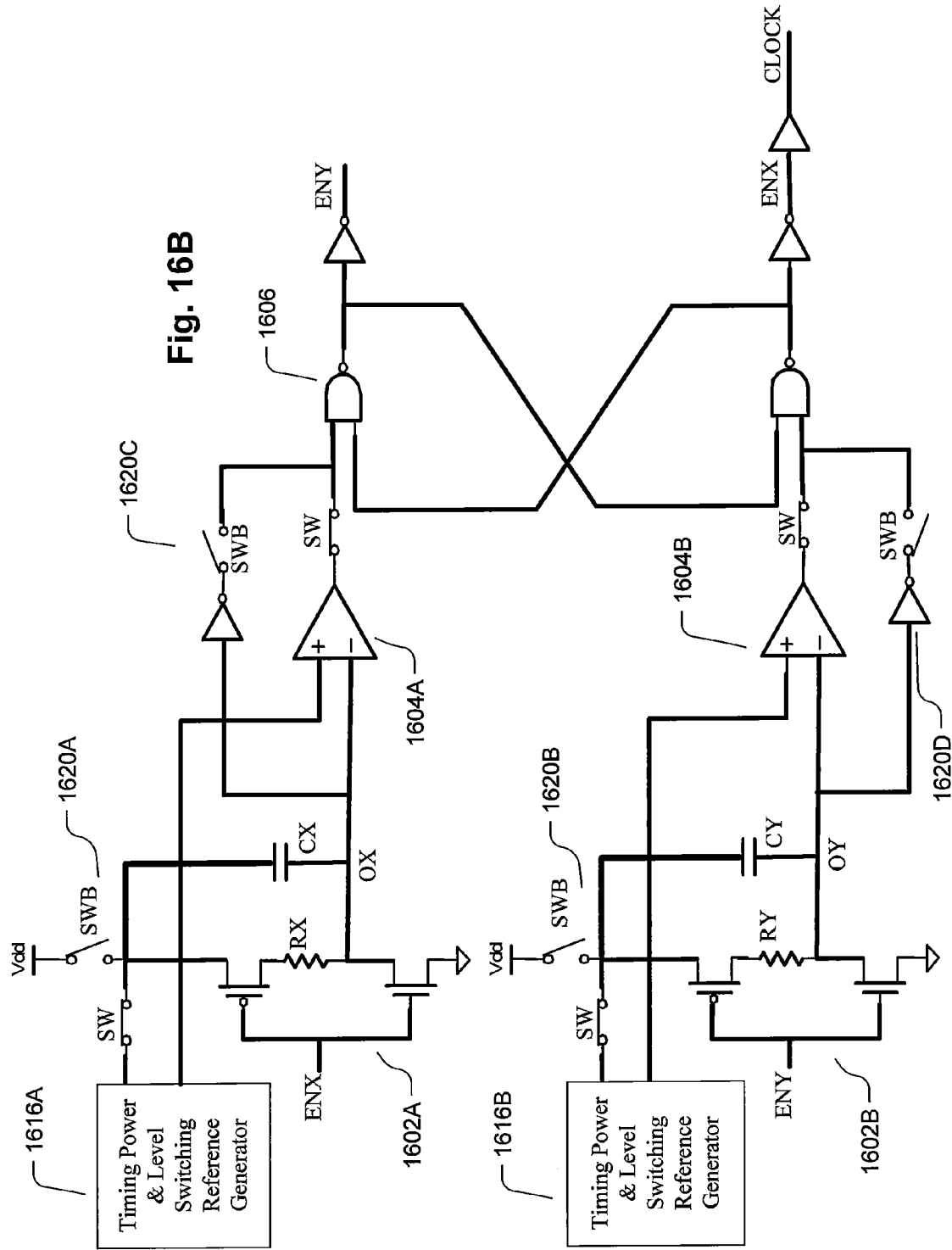

FIGS. 16A and 16B are circuit diagrams of an integrated clock circuit to switch the power of the clock. During power on, the stable power isn't ready, and needs the VDD power to generate the clock for the logic circuits. Logic circuitry waits for the stable power setup timing. When the stable power is ready, then the clock will switch to a stable clock.

Shown are parallel instances of timing circuitry 1602A and 1602B, parallel instances of level switching circuitry 1604A and 1604B, and the latch circuitry 1606. Also shown are parallel instances of timing power and level switching generator 1616A and 1616B, which generate power noise with the same noise phase in both the power noise in the timing circuitry power, and the power noise in the reference signal used in level detection of the timing circuitry output. Also shown are switches 1620A between the VDD and the timing power and level switching generator 1616A, switches 1620B between the VDD and the timing power and level switching generator 1616B, switches 1620C between different types of level switching circuitry 1604A and the latch 1606, and switches 1620D between different types of level switching circuitry 1604B and the latch 1606.

In FIG. 16A the capacitance circuitry CX or CY is coupled towards ground. In FIG. 16B the capacitance circuitry CX or CY is coupled towards power 1616A or 1616B.

Figure 17:
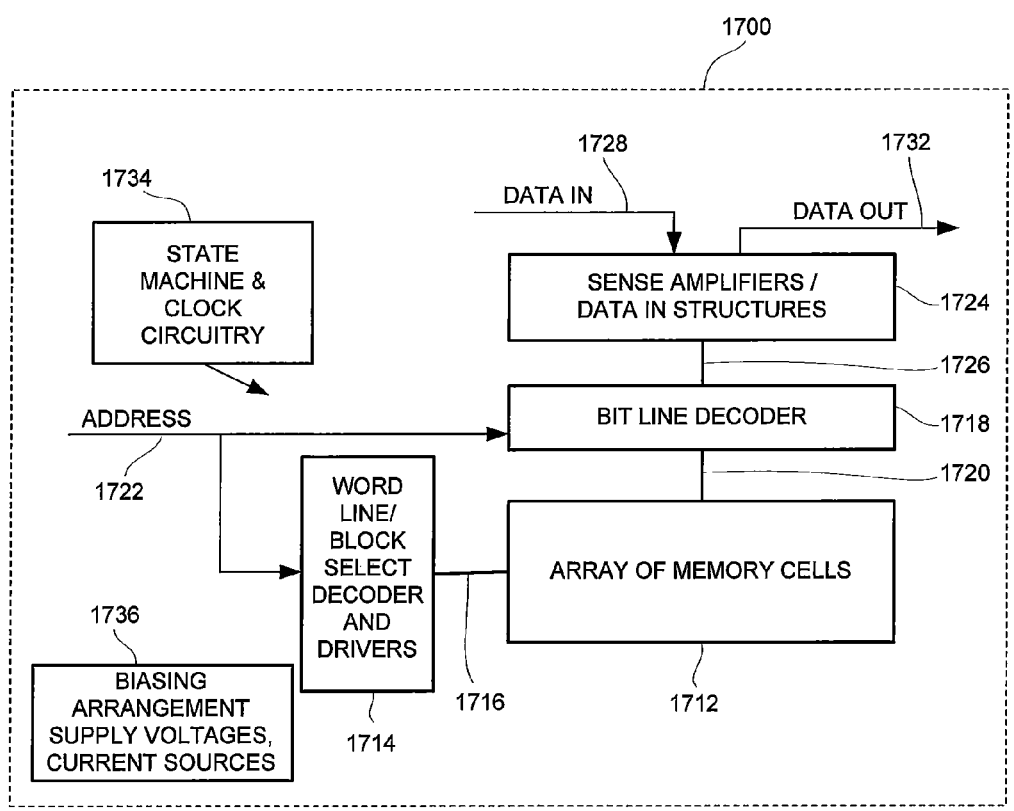
FIG. 17 is block diagram of a memory circuit with an improved integrated clock circuit as discussed herein.

FIG. 17 is block diagram of a memory circuit with an improved integrated clock circuit as discussed herein.

FIG. 17 is a simplified block diagram of an integrated circuit 1700 including a memory array 1712. A word line (or row) and block select decoder 1714 is coupled to, and in electrical communication with, a plurality 1716 of word lines and string select lines, and arranged along rows in the memory array 1712. A bit line (column) decoder and drivers 1718 are coupled to and in electrical communication with a plurality of bit lines 1720 arranged along columns in the memory array 1712 for reading data from, and writing data to, the memory cells in the memory array 1712. Addresses are supplied on bus 1722 to the word line decoder and drivers 1714 and to the bit line decoder 1718. Sense amplifiers and data-in structures in block 1724, including current sources for the read, program and erase modes, are coupled to the bit line decoder 1718 via the bus 1726. Data is supplied via the data-in line 1728 from input/output ports on the integrated circuit 1710, to the data-in structures in block 1724. In the illustrated embodiment, other circuitry 1730 is included on the integrated circuit 1700, such as a general purpose processor or special purpose application circuitry, or a combination of modules providing system-on-a-chip functionality supported by the memory cell array. Data is supplied via the data-out line 1732 from the sense amplifiers in block 1724 to input/output ports on the integrated circuit 1700, or to other data destinations internal or external to the integrated circuit 1700. State machine and improved clock circuitry (as discussed herein) are in circuitry 1734.

Figure 18:
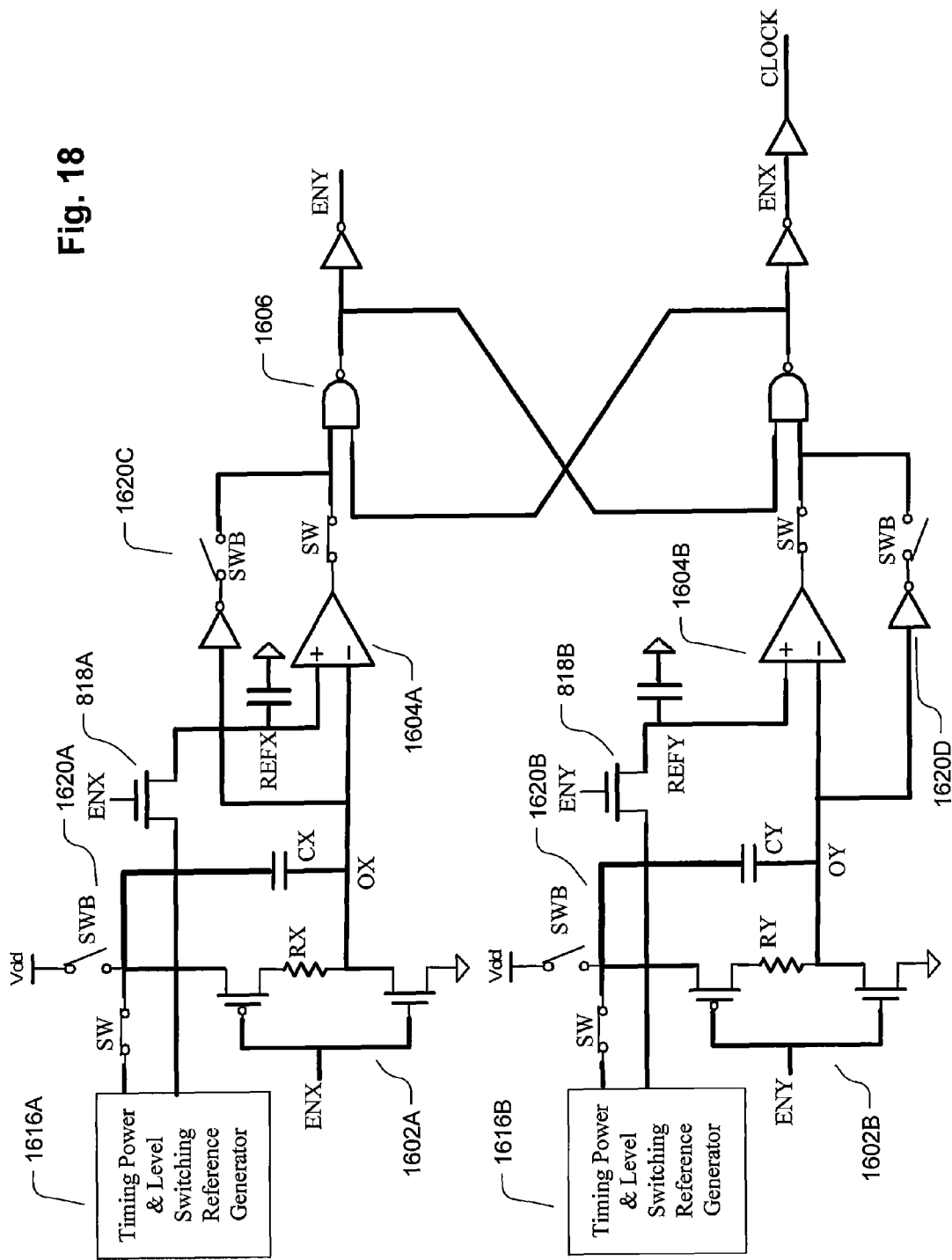
FIG. 18 is a circuit diagram, similar to FIG. 16, of an integrated clock circuit with tolerance to power noise, and further including switching circuitry between the reference generator and the op amp.

FIG. 18 is a circuit diagram, similar to FIG. 16, of an integrated clock circuit with tolerance to power noise, and further including switching circuitry between the reference generator and the op amp. As in FIG. 8, the switching transistor 818A is turned on by signal ENX and the switching transistor 818B is turned on by signal ENY. Similar to FIG. 8, ground noise coming from the timing power and level switching generator 1616A and 1616B is stored in the capacitive node REF X or REFY.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An apparatus, comprising:
a clock integrated circuit, comprising:
a first reference signal including a varying noise signal;
a timing circuit having an output alternating between the first reference signal and a second reference signal at a rate determined by a time constant determining timing of a clock signal output of the clock integrated circuit, wherein an output of the timing circuit stores the value of the varying noise signal included in the first reference signal, when the timing circuit output changes between (i) falling from the second reference signal to the first reference signal and (ii) rising from the first reference signal to the second reference signal;
a reference circuit having an output selectably coupled to the varying noise signal, such that the output of the reference circuit stores the value of the varying noise signal, when the timing circuit output changes between (i) falling from the second reference signal to the first reference signal and (ii) rising from the first reference signal to the second reference signal; and
a level switching circuit comparing the output of the reference circuit with the output of the timing circuit, such that an output of the level switching circuit determines the clock signal output of the clock integrated circuit.

2. The apparatus of claim 1, wherein the timing circuit selectably receives the varying noise signal included in the first reference signal, depending on whether the output of the timing circuit is (i) falling from the second reference signal to the first reference signal or (ii) rising from the first reference signal to the second reference signal.

3. The apparatus of claim 1, wherein the output of the reference circuit being coupled to the varying noise signal corresponds to the timing circuit falling from the second reference signal to the first reference signal, and the output of the reference circuit being decoupled from the varying noise signal corresponds to the timing circuit rising from the first reference signal to the second reference signal.

4. The apparatus of claim 1, wherein the first reference signal is a first reference voltage, the second reference signal is a second reference voltage, and the timing circuit alternates between charging from the first reference voltage to the second reference voltage and discharging from the second reference voltage to the first reference voltage.

5. The apparatus of claim 1, wherein the first reference signal is a first reference voltage, the second reference signal is a second reference voltage, and the timing circuit alternates between charging from the first reference voltage to the second reference voltage and discharging from the second reference voltage to the first reference voltage, and
wherein the output of the reference circuit stores the value of the varying noise signal, when the timing circuit output changes from (i) falling from the second reference voltage to the first reference voltage to (ii) rising from the first reference voltage to the second reference voltage.

6. The apparatus of claim 1, wherein the first reference signal is a first reference voltage, the second reference signal is a second reference voltage, and the varying noise signal is a varying noise voltage.

7. The apparatus of claim 1, wherein the first reference signal is a ground reference voltage.

8. The apparatus of claim 1, wherein the time constant characterizes an exponential signal.

9. The apparatus of claim 1, wherein the level switching circuit compares the output of the reference circuit including the stored value of the varying noise signal, with the output of the timing circuit including the stored value of the varying noise signal, to determine the clock signal output of the clock integrated circuit.

10. The apparatus of claim 1, wherein the timing circuit is configured to couple the first reference signal to the timing circuit and decouple the second reference signal from the timing circuit, wherein the first reference signal has the varying noise signal, such that the timing circuit discharges from the second reference signal to the first reference signal; and
wherein the timing circuit is configured to decouple the first reference signal from the timing circuit and couple the second reference signal to the timing circuit, wherein the first reference signal has the varying noise signal, such that the timing circuit charges from the first reference signal to the second reference signal.

11. The apparatus of claim 1, wherein the timing circuit is configured to couple the first reference signal to the timing circuit and decouple the second reference signal from the timing circuit, wherein the first reference signal has the varying noise signal, such that the timing circuit discharges from the second reference signal to the first reference signal; and
wherein the timing circuit is configured to decouple the first reference signal from the timing circuit and couple the second reference signal to the timing circuit, wherein the first reference signal has the varying noise signal, such that the timing circuit charges from the first reference signal to the second reference signal, and
wherein the timing circuit is configured to store the value of the varying noise signal at the timing circuit when the timing circuit changes from (i) falling from the second reference signal to the first reference signal to (ii) rising from the first reference signal to the second reference signal.

12. The apparatus of claim 1, wherein the output of the reference circuit is configured to be coupled to the varying noise signal, to correspond to (ii) falling from the second reference signal to the first reference signal; and
wherein the output of the reference circuit is configured to be decoupled from the varying noise signal, to correspond to (ii) rising from the first reference signal to the second reference signal, including:
wherein the output of the reference circuit is configured to store the value of the varying noise signal when the timing circuit changes from (i) falling from the second reference signal to the first reference signal to (ii) rising from the first reference signal to the second reference signal.

13. The apparatus of claim 1, the clock integrated circuit further comprising:
a latch circuit generating the clock signal output of the clock integrated circuit, responsive to the output of the level switching circuit.

14. A method, comprising:
determining timing of a clock integrated circuit by alternating a timing circuit output between a first reference signal and a second reference signal at a rate determined by a time constant determining the timing of the clock integrated circuit, wherein an output of the timing circuit stores a value of a varying noise signal included in the first reference signal, when the timing circuit output changes between (i) falling from the second reference signal to the first reference signal and (ii) rising from the first reference signal to the second reference signal;
selectably coupling the varying noise signal to a reference circuit output of the clock integrated circuit, such that the reference circuit output stores the value of the varying noise signal, when the timing circuit output changes between (i) falling from the second reference signal to the first reference signal and (ii) rising from the first reference signal to the second reference signal; and
comparing the reference circuit output with the timing circuit output, to determine a clock signal output of the clock integrated circuit.

15. The method of claim 14, wherein the first reference signal is a first reference voltage, the second reference signal is a second reference voltage, and the timing circuit alternates between charging from the first reference voltage to the second reference voltage and discharging from the second reference voltage to the first reference voltage.

16. The method of claim 14, wherein the first reference signal is a first reference voltage, the second reference signal is a second reference voltage, and the varying noise signal is a varying noise voltage.

17. The method of claim 14, wherein the first reference signal is a ground reference voltage.

18. The method of claim 14, wherein the time constant characterizes an exponential signal.

19. The method of claim 14, wherein said comparing, includes:
comparing the reference circuit output including the stored value of the varying noise signal, with the timing circuit output including the stored value of the varying noise signal, to determine the clock signal output of the clock integrated circuit.

20. The method of claim 14, wherein said determining the timing includes:
coupling the first reference signal to the timing circuit and decoupling the second reference signal from the timing circuit, wherein the first reference signal has the varying noise signal, such that the timing circuit discharges from the second reference signal to the first reference signal; and
decoupling the first reference signal from the timing circuit and coupling the second reference signal to the timing circuit, wherein the first reference signal has the varying noise signal, such that the timing circuit charges from the first reference signal to the second reference signal.

21. The method of claim 14, wherein said determining the timing includes:
coupling the first reference signal to the timing circuit and decoupling the second reference signal from the timing circuit, wherein the first reference signal has the varying noise signal, such that the timing circuit discharges from the second reference signal to the first reference signal; and
decoupling the first reference signal from the timing circuit and coupling the second reference signal to the timing circuit, wherein the first reference signal has the varying noise signal, such that the timing circuit charges from the first reference signal to the second reference signal, including:
storing the value of the varying noise signal at the timing circuit when the timing circuit changes from (i) falling from the second reference signal to the first reference signal to (ii) rising from the first reference signal to the second reference signal.

22. The method of claim 14, wherein said selectably coupling includes:

coupling the reference circuit output to the varying noise signal, to correspond to (ii) falling from the second reference signal to the first reference signal; and decoupling the reference circuit output from the varying noise signal, to correspond to (ii) rising from the first reference signal to the second reference signal, including:

storing the value of the varying noise signal output at the timing circuit when the timing circuit changes from (i) falling from the second reference signal to the first reference signal to (ii) rising from the first reference signal to the second reference signal.

23. The method of claim 14, wherein said comparing, includes:

after said comparing the reference circuit output with the timing circuit output, generating the clock signal output of the clock integrated circuit with a latch circuit.

24. A method of manufacturing an apparatus, comprising:

providing a clock integrated circuit, comprising:

providing a first reference signal including a varying noise signal;

providing a timing circuit having an output alternating between the first reference signal and a second reference signal at a rate determined by a time constant determining timing of a clock signal output of the clock integrated circuit, wherein an output of the timing circuit stores the value of the varying noise signal included in the first reference signal, when the timing circuit output changes between (i) falling from the second reference signal to the first reference signal and (ii) rising from the first reference signal to the second reference signal;

providing a reference circuit having an output selectably coupled to the varying noise signal, such that the output of the reference circuit stores the value of the varying noise signal, when the timing circuit output changes between (i) falling from the second reference signal to the first reference signal and (ii) rising from the first reference signal to the second reference signal; and providing a level switching circuit comparing the output of the reference circuit with the output of the timing circuit, such that an output of the level switching circuit determines the clock signal output of the clock integrated circuit.

* * * * *